(12) United States Patent
Yoshikawa

(10) Patent No.: US 10,906,800 B2
(45) Date of Patent: Feb. 2, 2021

(54) SEMICONDUCTOR PRESSURE SENSOR

(71) Applicant: Mitsubishi Electric Corporation, Tokyo (JP)

(72) Inventor: Eiji Yoshikawa, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 0 days.

(21) Appl. No.: 15/017,733

(22) Filed: Feb. 8, 2016

(65) Prior Publication Data
US 2017/0113917 A1    Apr. 27, 2017

(30) Foreign Application Priority Data
Oct. 23, 2015   (JP) .................................. 2015-208550

(51) Int. Cl.
 *B81B 3/00*  (2006.01)
 *B81C 1/00*  (2006.01)
 *G01L 9/00*  (2006.01)

(52) U.S. Cl.
 CPC ........ *B81B 3/0021* (2013.01); *B81C 1/00293* (2013.01); *G01L 9/0048* (2013.01); *B81B 2201/0264* (2013.01); *B81B 2203/0127* (2013.01)

(58) Field of Classification Search
 CPC .... B81B 2201/0264; B81B 2203/0172; H01L 29/84
 See application file for complete search history.

(56) References Cited

U.S. PATENT DOCUMENTS 5,310,610 A     5/1994 Furubayashi et al.
6,649,468 B2 * 11/2003 Schindler .......... H01L 21/76828
                                                    257/295
(Continued)

FOREIGN PATENT DOCUMENTS

JP   01281774 A   11/1989
JP   05048118 A    2/1993
(Continued)

OTHER PUBLICATIONS

Communication dated Aug. 17, 2016, issued by the Japan Patent Office in corresponding Japanese Application No. 2015-208550.
(Continued)

*Primary Examiner* — Stephen M Bradley
(74) *Attorney, Agent, or Firm* — Sughrue Mion, PLLC; Richard C. Turner

(57) ABSTRACT

In a semiconductor pressure sensor element, a first hydrogen permeation protection film is provided on a principal surface side of a first silicon substrate, and a second hydrogen permeation protection film is provided on a principal surface side of a second silicon substrate. The permeation paths of the hydrogen fluxes shown by the arrows A and B in FIG. 9 are blocked by the films. Also, a trench surrounding a reference pressure chamber is provided, and the first hydrogen permeation protection film and a third hydrogen permeation protection film are joined at the bottom portion of the trench, thereby blocking the permeation path of the hydrogen flux shown by the arrow C in FIG. 9. Furthermore, by providing a hydrogen storage chamber, hydrogen is trapped before the hydrogen reaches the reference pressure chamber.

37 Claims, 12 Drawing Sheets

(56) References Cited

U.S. PATENT DOCUMENTS

| | | | |
|---|---|---|---|
| 8,293,557 B2* | 10/2012 | Inoue | H01H 59/0009 |
| | | | 257/E21.32 |
| 2006/0125879 A1* | 6/2006 | Fujii | B41J 2/14274 |
| | | | 347/54 |
| 2007/0001174 A1 | 1/2007 | Ring et al. | |
| 2007/0001176 A1 | 1/2007 | Ward, III et al. | |
| 2007/0018272 A1 | 1/2007 | Henning et al. | |
| 2008/0035934 A1 | 2/2008 | Sheppard et al. | |
| 2008/0128841 A1* | 6/2008 | Fujimori | B81B 7/0058 |
| | | | 257/418 |
| 2008/0190207 A1* | 8/2008 | Yang | G01L 9/0054 |
| | | | 73/708 |
| 2009/0215280 A1 | 8/2009 | Ring et al. | |
| 2010/0139391 A1* | 6/2010 | Sakuma | B81B 3/0072 |
| | | | 73/204.26 |
| 2011/0159627 A1 | 6/2011 | Mantravadi et al. | |
| 2013/0036827 A1 | 2/2013 | Besling | |
| 2013/0087864 A1* | 4/2013 | Ten Have | B81C 99/0035 |
| | | | 257/419 |
| 2013/0105922 A1* | 5/2013 | Yoshikawa | G01L 9/0048 |
| | | | 257/419 |
| 2015/0274507 A1* | 10/2015 | Xu | B81B 7/007 |
| | | | 257/417 |
| 2015/0292973 A1* | 10/2015 | Ding | G01L 9/0054 |
| | | | 73/706 |

FOREIGN PATENT DOCUMENTS

| | | |
|---|---|---|
| JP | 6-216121 A | 8/1994 |
| JP | 09008326 A | 1/1997 |
| JP | 4161432 B2 | 10/2008 |
| JP | 2008544578 A | 12/2008 |
| JP | 2011137818 A | 7/2011 |
| JP | 2011164057 A | 8/2011 |
| JP | 2013-219198 A | 10/2013 |

OTHER PUBLICATIONS

Communication dated Feb. 14, 2017 from the Japanese Patent Office in counterpart application No. 2015-208550.

Communication dated Jul. 11, 2017, from the Japanese Patent Office in counterpart application No. 2015-208550.

* cited by examiner

SEMICONDUCTOR PRESSURE SENSOR

BACKGROUND OF THE INVENTION

Field of the Invention

The present invention relates to a semiconductor pressure sensor, and particularly to a semiconductor pressure sensor for measuring the pressure of a hydrogen gas supplied to a fuel cell in a fuel cell system.

Description of the Background Art

A fuel cell stack which generates a high voltage is used for a fuel cell system of a fuel cell vehicle which has started to be commercially available in recent years. The fuel cell stack is such that a membrane electrode assembly (MEA), which includes an anode side electrode, an electrolyte film, and a cathode side electrode, and a separator are paired into a fuel cell, and a fuel cell laminate into which a large number of fuel cells are laminated is sandwiched by insulating plates, collecting plates, end plates, and the like.

In the fuel cell stack, for example, a hydrogen gas is supplied as a fuel gas to the anode side, while, for example air is supplied as an oxidation gas to the cathode side, thereby causing a cell reaction, and an electromotive force is generated, thus producing water in the cathode side electrode. In order to efficiently generate electricity, it is necessary that the amount of hydrogen gas and oxidation gas to be supplied to the fuel cell stack is measured with high precision, and after being controlled without excess or deficiency, is supplied to the fuel cell stack.

However, at the present point, many problems to be improved exist in a pressure sensor for measuring the pressure of a hydrogen gas supplied to the fuel cell stack. A hydrogen gas to be measured, having a very small molecular size such as a covalent radium of about 37 μm and a van der Waals radius of about 120 μm, has the characteristics that the hydrogen gas by, for example, recombining remaining in the form of gas molecules or after ionizing and intruding, easily permeates different materials, and this makes it difficult to measure the pressure. Furthermore, the hydrogen gas also has the characteristics of embrittling many metal materials.

Also, neither the specifications nor prices of various types of parts configuring the fuel cell system are still made appropriate enough, a reduction in price is an urgent issue in the widespread use of the fuel cell vehicle. Because of this, it is desirable to use an inexpensive semiconductor pressure sensor which can be mass produced, but a heretofore known semiconductor pressure sensor is not assumed to be used in the fuel cell system, and no adequate measures have been taken to solve the problem of hydrogen permeation.

A heretofore known semiconductor pressure sensor, a medium to be measured by which is assumed to be mainly air, being such that a diaphragm is formed of a single crystal silicon substrate and that a glass substrate is used as a base which seals a reference pressure chamber, has characteristics such as inexpensiveness, high precision, and high reliability. However, when the heretofore known semiconductor pressure sensor is used to measure the pressure of a hydrogen gas in the fuel cell system, the hydrogen gas easily permeates the single crystal silicon and glass, no high precision measurement can be carried out. This kind of phenomenon becomes more conspicuous as the temperature and pressure of the hydrogen gas increases.

Also, a semiconductor pressure sensor (refer to FIG. 19) disclosed in PTL 1, wherein a reference pressure chamber 4 is configured by joining a first semiconductor substrate 1, which has a diaphragm 8, and a second semiconductor substrate 2 in a vacuum, includes a trap chamber 18 at the joining interface of the first semiconductor substrate 1 and second semiconductor substrate 2. The trap chamber 18 is provided for the purpose of trapping a gas such as hydrogen, oxygen, or water generated when joining the first semiconductor substrate 1 and second semiconductor substrate 2.

PTL 1: Japanese Patent No. 4,161,432

As heretofore described, the hydrogen permeation coefficients of many materials containing single crystal silicon increase exponentially at such a high temperature and pressure as in the fuel cell system compared with at room temperature and atmospheric pressure. Furthermore, as the reference pressure chamber is vacuumized to measure absolute pressure, it is easy for a hydrogen gas to intrude into the reference pressure chamber due to a pressure difference from outside. When hydrogen intrudes into the reference pressure chamber, the pressure rises, and the output of the sensor fluctuates. Because of this, with the heretofore known semiconductor pressure sensor, it is difficult to measure the pressure of a hydrogen gas with high precision.

Furthermore, as the semiconductor pressure sensor becomes highly elaborated and integrated in recent years, the volume of the reference pressure chamber also decreases further. Because of this, even though a very small amount of hydrogen gas intrudes into the reference pressure chamber, a rise in the pressure of the reference pressure chamber becomes significantly higher, resulting in a more serious effect of hydrogen permeation.

Also, in a process of manufacturing a semiconductor pressure sensor, the step of heat treatment in a hydrogen atmosphere is carried out a plurality of times. For example, sintering treatment is carried out under a reducing atmosphere containing a hydrogen gas in order to stabilize the electrical characteristics of a metal electrode film (of, for example, Al, Al—Si, or Al—Si—Cu) for taking out an electrical signal to the external, but as the treatment temperature at this time is a high temperature of about 450° C., the hydrogen permeation coefficient of silicon is significantly higher than at room temperature.

Furthermore, a protection film is formed on a metal wiring in order to protect a semiconductor element against an external harmful environment such as moisture or dust, but it is often the case that this step is also carried out in a hydrogen atmosphere. In this way, as a hydrogen gas and hydrogen ions are generated in each treatment step carried out under the hydrogen atmosphere, there is the manufacturing problem that when a reference pressure chamber is formed at this point, hydrogen intrudes into the reference pressure chamber, thus making it difficult to measure the absolute pressure.

The semiconductor pressure sensor disclosed in PTL 1 includes the trap chamber 18 at the joining interface of the first semiconductor substrate 1 and second semiconductor substrate 2, thereby preventing a hydrogen gas generated in the heat treatment from intruding into the reference pressure chamber 4 along the interface of the two substrates. However, when the semiconductor pressure sensor is used to measure the pressure of a hydrogen gas in the fuel cell system, it cannot be said that the measures to prevent the intrusion of hydrogen into the reference pressure chamber 4 are sufficient.

The reason is that the semiconductor pressure sensor disclosed in PTL 1 is totally unprotected against the hydrogen permeation from the front surface of the diaphragm 8. As the area on the front surface side of the diaphragm 8 exposed to hydrogen is largest, and the permeation distance from the front surface side of the diaphragm 8 to the reference pressure chamber 4 is shortest, it is conceivable that the front side surface of the diaphragm 8 is a largest hydrogen permeation path. Also, it is conceivable that there is also hydrogen permeation into the reference pressure chamber 4 from the rear surface side of the second semiconductor substrate 2 or from the side surface to be exposed when dicing a silicon wafer into individual pieces, but no measures to prevent hydrogen permeation are taken against these paths either. Consequently, it is conceivable that hydrogen permeating from the paths intrudes into the reference pressure chamber 4.

SUMMARY OF THE INVENTION

The invention, having been contrived in order to solve the heretofore described kinds of problems, has for its object to obtain an inexpensive semiconductor pressure sensor wherein it is possible to prevent intrusion of a hydrogen gas into a reference pressure chamber of the semiconductor pressure sensor including a diaphragm, and thus possible to measure the pressure of the hydrogen gas with high precision.

A semiconductor pressure sensor according to an aspect of the invention includes a first silicon substrate having a diaphragm; a first hydrogen permeation protection film provided on the side of one principal surface of the first silicon substrate; a second silicon substrate, one principal surface of which having a depressed portion is joined to another principal surface of the first silicon substrate via an embedded oxide film; and a reference pressure chamber, the space of which, enclosed by the depressed portion and the other principal surface of the first silicon substrate, is brought into a vacuum state.

Also, a semiconductor pressure sensor according to an aspect of the invention includes a first silicon substrate having a diaphragm; a first hydrogen permeation protection film provided on the side of one principal surface of the first silicon substrate; a second silicon substrate which has a hole portion passing through from one principal surface to another principal surface, and the one principal surface of which is joined to another principal surface of the first silicon substrate via an embedded oxide film; a third silicon substrate, one principal surface of which is joined to the other principal surface of the second silicon substrate; and a reference pressure chamber, the space of which, enclosed by the hole portion, the other principal surface of the first silicon substrate, and the one principal surface of the third silicon substrate, is brought into a vacuum state.

According to the invention, as a hydrogen permeation path from the front surface side of the diaphragm to the reference pressure chamber is blocked by providing the first hydrogen permeation protection film on the side of the one principal surface of the first silicon substrate having the diaphragm, it is possible to obtain an inexpensive semiconductor pressure sensor with high measurement precision wherein it is possible to effectively prevent the intrusion of hydrogen into the reference pressure chamber.

The foregoing and other objects, features, aspects and advantages of the present invention will become more apparent from the following detailed description of the present invention when taken in conjunction with the accompanying drawings.

DETAILED DESCRIOTION OF THE PREFERRRED EMBODIMENTS

First Embodiment

Figure 1:
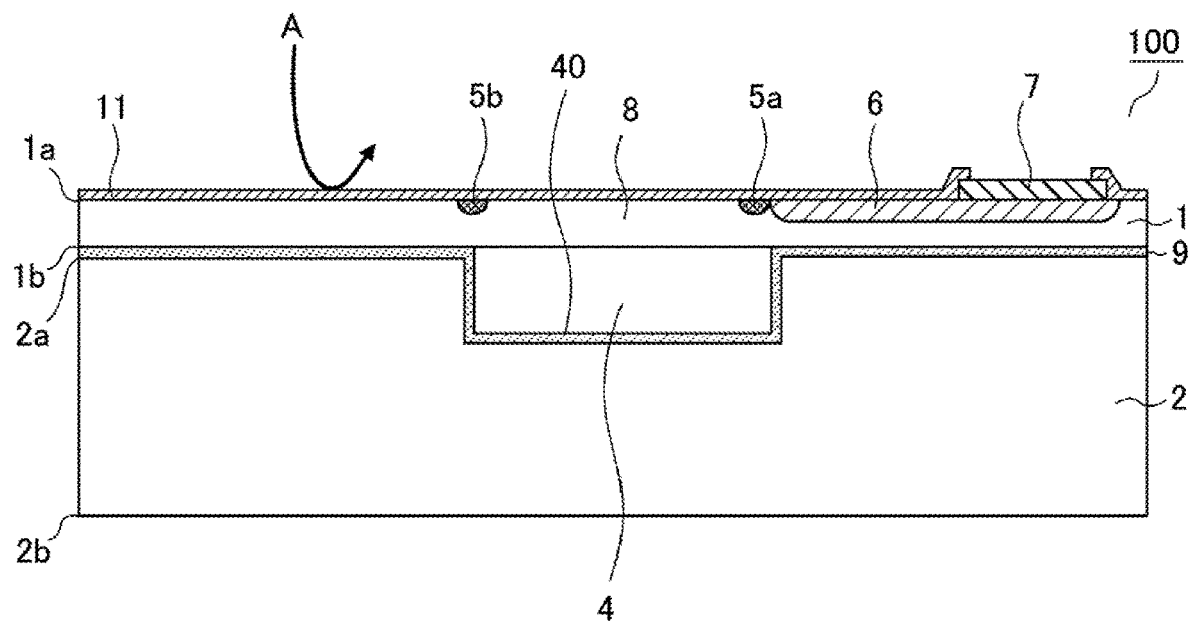
FIG. 1 is a sectional view showing a semiconductor pressure sensor element according to First Embodiment of the invention.

Hereafter, a description will be given, based on the drawings, of a semiconductor pressure sensor according to First Embodiment of the invention. In the drawings, the same reference signs are given to identical and equivalent portions. FIG. 1 shows a semiconductor pressure sensor element according to First Embodiment. A semiconductor pressure sensor element 100, which measures the pressure of a hydrogen gas supplied to a fuel cell in a fuel cell system, includes a first silicon substrate 1 having one principal surface 1a and another principal surface 1b, which are opposite to each other, and a second silicon substrate 2 having one principal surface 2a and another principal surface 2b, which are opposite to each other, as shown in FIG. 1.

The semiconductor pressure sensor element 100 has a diaphragm 8, which is a pressure receiving portion, in the first silicon substrate 1. The semiconductor pressure sensor element 100 has, around the diaphragm 8, piezoresistors 5a and 5b (collectively called piezoresistors 5) which convert pressure applied to the diaphragm 8 to an electrical signal. FIG. 1 shows two piezoresistors 5a and 5b, but actually, there are four piezoresistors 5 (refer to FIG. 6). Also, a diffusion wiring layer 6 and a metal electrode film 7 are provided, and furthermore, a first hydrogen permeation protection film 11 is provided, on the side of the principal surface 1a of the first silicon substrate 1.

The second silicon substrate 2 has a depressed portion 40 in the principal surface 2a, and the principal surface 2a is joined to the principal surface 1b of the first silicon substrate 1 via an embedded oxide film 9. A reference pressure chamber 4, the space of which, enclosed by the depressed portion 40 of the second silicon substrate 2 and the principal surface 1b of the first silicon substrate 1, is brought into a vacuum state, serves as a reference based on which to measure absolute pressure. When pressure is applied to the diaphragm 8 by a hydrogen gas which is a gas to be measured, the diaphragm 8 bends, and the resistance value of the piezoresistors 5 changes. The piezoresistors 5 convert the resistance value change to an electrical signal and outputs the electrical signal, and the output electrical signal is taken out to the external from the metal electrode film 7 via the diffusion wiring layer 6.

A brief description will be given of a method of manufacturing the semiconductor sensor element 100. Firstly, the depressed portion 40 is formed in the principal surface 2a of the second silicon substrate 2 by etching. At this time, it is possible to form the shape of the diaphragm 8 with high precision by using inductive coupled plasma-reactive ion etching (ICP-RIE) using the Bosch process. However, an etching method is not limited to this, and the depressed portion 40 may be formed by wet anisotropic etching using an etching liquid such as potassium hydroxide (KOH) or tetramethylammonium hydroxide (TMAH).

The reference pressure chamber 4 is preferably large in volume from the viewpoint that a change in the internal pressure due to intrusion of hydrogen is kept down, and for this purpose, it is necessary to etch the depressed portion 40 deeply, but the processing burden increases. In the invention, as the intrusion of hydrogen into the reference pressure chamber 4 is prevented by the first hydrogen permeation protection film 11 shown in FIG. 1 and a second hydrogen permeation protection film 12 (refer to FIG. 2) and third hydrogen permeation protection film 13 (refer to FIG. 5) to be described hereafter, the depth of the depressed portion 40 only has to be about 10 μm to 100 μm.

Subsequently, the embedded oxide film 9 is formed by thermal oxidation on the principal surface 2a of the second silicon substrate 2 in which the depressed portion 40 is formed. The embedded oxide film 9 is necessary to promote the joining with the first silicon substrate 1, and the thickness of the embedded oxide film 9 is suitably about 0.1 μm to 0.5 μm. The embedded oxide film 9 may be formed on the principal surface 1b of the first silicon substrate 1.

Subsequently, the principal surface 1b of the first silicon substrate 1 and the principal surface 2a of the second silicon substrate 2 are joined in a vacuum, thus forming the reference pressure chamber 4. It is preferable to carry out the joining in an acid atmosphere at a high temperature of about 1,100° C., but by raising the temperature to about 1,200° C., it is possible to improve joining strength.

After the first silicon substrate 1 and the second silicon substrate 2 are joined, the thickness of the diaphragm 8 is adjusted in response to the pressure of the gas to be measured. Specifically, the first silicon substrate 1 is ground and polished, thereby forming the diaphragm 8 to a predetermined thickness. An SOI wafer having the reference pressure chamber 4 can be obtained by the above steps.

Subsequently, after the piezoresistors 5 and the diffusion wiring layer 6 are formed around the diaphragm 8 by ion implantation and the subsequent heat treatment or the like, Al, Al—Si, Al—Si—Cu, or the like, is formed into a film by a method such as sputtering, thus forming the metal electrode film 7. Furthermore, the first hydrogen permeation protection film 11 is formed on the side of the principal surface 1a of the first silicon substrate 1, thus obtaining the semiconductor pressure sensor element 100 shown in FIG. 1.

As the first hydrogen permeation protection film 11, a silicon nitride film ($SiN_x$) which can be formed by a film formation method, such as a versatile chemical vapor deposition (CVD), is suitable in a semiconductor wafer process. The silicon nitride film, as it is large in residual tensile stress, is preferably thin in order to suppress the effect on the characteristics and reliability of the sensor. Meanwhile, a certain amount of thickness is necessary to prevent the intrusion of hydrogen into the reference pressure chamber 4. Because of this, the thickness of the silicon nitride film is set to 0.01 μm or more and preferably selected in a range of 0.04 μm to 0.2 μm.

An index x representing the composition ratio of silicon atoms and nitrogen atoms of the silicon nitride film ($SiN_x$) can take values from 0 to 4/3 in theory. When x is 4/3, of the values, which is the maximum value, the silicon nitride film has a stoichiometric composition ratio, and is expressed as $Si_3N_4$. When at this composition ratio, all bonds are a Si—N bond, which is an atomic arrangement wherein $Si_3N_4$ is most densely filled with silicon atoms and nitrogen atoms. As silicon atoms and nitrogen atoms are different in atom size, in the case of $Si_3N_4$ which is most densely filled with silicon atoms and nitrogen atoms, no void which hydrogen atoms permeate exists, and hydrogen permeation protection performance is highest.

As opposed to this, as the value x becomes smaller than 4/3, the bonds of silicon atoms (Si—Si) increase. When silicon atoms of the same size bond, the atom arrangement is not of a structure which is most densely filled with silicon atoms and nitrogen atoms, voids larger than the size of hydrogen atoms are generated. The smaller the value x, the larger the voids, and the voids communicate with each other, thus forming leak paths which hydrogen atoms permeate.

In particular, when the value x is ½ or less, the network of the leak paths is three-dimensionally configured, leading to a complete loss of the hydrogen permeation protection performance. Owing to the above kinds of characteristics, by the value x representing the composition ratio of silicon atoms and nitrogen atoms of the silicon nitride film satisfying $1 \leq x \leq 4/3$, and by securing a fixed film thickness of the heretofore described kind, it is possible to obtain effective hydrogen permeation protection performance.

The first hydrogen permeation protection film 11 is not limited to the silicon nitride film, and it is also possible to use an aluminum oxide film ($AlO_x$) which is a material high in the affinity with the semiconductor wafer process. The thickness of the first hydrogen permeation protection film 11 is suitably in a range of 0.04 μm to 0.2 μm which is equal to that of the silicon nitride film. In particular, $Al_2O_3$, of aluminum oxide films, is on the order of four digits smaller in hydrogen permeation coefficient than at least SUS316, although depending on the temperature. The aluminum oxide film can be formed by sputtering, CVD, or the like.

As the aluminum oxide film has good step coverage, it is possible to obtain high hydrogen permeation protection performance without generating a void even in the case of a structure with steps. Meanwhile, aluminum oxide is such that pinholes, microcracks, or the like are likely to be generated, and that the management of crystallinity is important in order to obtain effective hydrogen permeation protection performance.

Also, as the first hydrogen permeation protection film 11, it is also possible to use an erbium oxide film ($Er_2O_3$) still lower in hydrogen permeation coefficient. Erbium belongs to rare earth, but can be formed into a film by vacuum arc deposition, metal organic decomposition (MOD), metal organic chemical vapor deposition (MOCVD), or the like. By using the erbium oxide film, it is possible to obtain hydrogen permeation protection performance still higher than when using the aluminum oxide film.

In the semiconductor pressure sensor element 100, as the area on the front surface side of the diaphragm 8 exposed to hydrogen is largest, and the permeation distance from the front surface side of the diaphragm 8 to the reference pressure chamber 4 is shortest, the front surface side of the diaphragm 8 becomes the permeation path of the large hydrogen flux shown by the arrow A in FIG. 1. In First Embodiment, the hydrogen permeation path from the front surface side of the diaphragm 8 to the reference pressure chamber 4 is blocked by providing the first hydrogen permeation protection film 11 on the side of the principal surface 1a of the first silicon substrate 1.

Also, the first hydrogen permeation protection film 11 can be formed by a heretofore known semiconductor wafer process. For these reasons, according to First Embodiment, by providing the first hydrogen permeation protection film 11, it is possible to effectively prevent the intrusion of hydrogen into the reference pressure chamber 4 from the side of the principal surface 1a of the first silicon substrate 1, and it is possible to obtain the semiconductor pressure sensor element 100 which is inexpensive and high in measurement precision.

Second Embodiment

Figure 2:
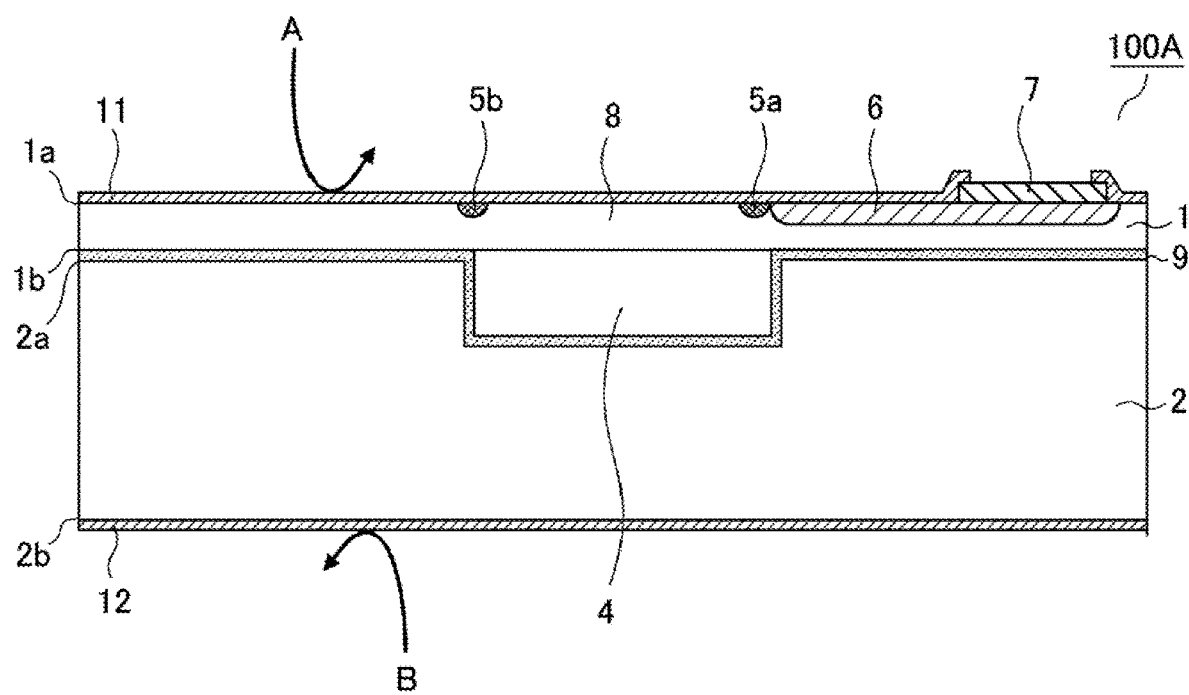
FIG. 2 is a sectional view showing a semiconductor pressure sensor element according to Second Embodiment of the invention.

FIG. 2 shows a semiconductor pressure sensor element according to Second Embodiment of the invention. A semiconductor pressure sensor element 100A according to Second Embodiment includes, in addition to the same components as those of the semiconductor pressure sensor element 100 (FIG. 1) according to First Embodiment, the second hydrogen permeation protection film 12 provided on the side of the principal surface 2b of the second silicon substrate 2. As the other components are the same as those of First Embodiment, a description thereof will be omitted.

As the area on the side of the principal surface 2b of the second silicon substrate 2 exposed to hydrogen is also large, in the same way as on the front surface side of the diaphragm 8, the side of the principal surface 2b of the second silicon substrate 2 becomes the permeation path of the large hydrogen flux shown by the arrow B in FIG. 2. However, as the distance from the principal surface 2b of the second silicon substrate 2 to the reference pressure chamber 4 is at least about 500 μm, and the thickness of the first silicon substrate 1 is about 10 μm to 20 μm, it takes a time 25 to 50 times longer than from the front surface side of the diaphragm 8 in order for hydrogen, which has permeated from the side of the principal surface 2b of the second silicon substrate 2, to reach the reference pressure chamber 4. However, even though there is a time delay for the hydrogen to reach the reference pressure chamber 4, the fact remains that the hydrogen still permeates.

The semiconductor pressure sensor element 100A is mounted on a base material, via a die bonding agent (neither the material nor the agent is shown), on the principal surface 2b of the second silicon substrate 2. Because of this, the principal surface 2b is covered with the die bonding agent, but the die bonding agent has no hydrogen permeation protection performance. Therefore, in Second Embodiment, the second hydrogen permeation protection film. 12 is provided on the side of the principal surface 2b of the second silicon substrate 2, thereby blocking the hydrogen permeation path from the side of the principal surface 2b of the second silicon substrate 2 to the reference pressure chamber 4.

As the second hydrogen permeation protection film 12, silicon nitride ($SiN_x$), which satisfies $1 \leq x \leq 4/3$ in the same way as in the first hydrogen permeation protection film 11, aluminum oxide ($AlO_x$), or erbium oxide ($Er_2O_3$) is used. By forming the first hydrogen permeation protection film 11 and second hydrogen permeation protection film 12 into the same film, it is possible to efficiently manufacture the hydrogen permeation protection film at low cost.

According to the semiconductor pressure sensor element 100A of Second Embodiment, in addition to the same advantageous effects as in First Embodiment, by providing the second hydrogen permeation protection film 12, it is possible to prevent the intrusion of hydrogen into the reference pressure chamber 4 from the side of the principal surface 2b of the second silicon substrate 2, leading to an improvement in measurement precision. Also, as the first hydrogen permeation protection film 11 and the second hydrogen permeation protection film 12 cancel out their residual stresses, warpage of the semiconductor pressure sensor element 100A is suppressed, and it is possible to suppress a decrease in measurement precision due to the warpage.

Third Embodiment

Figure 3:
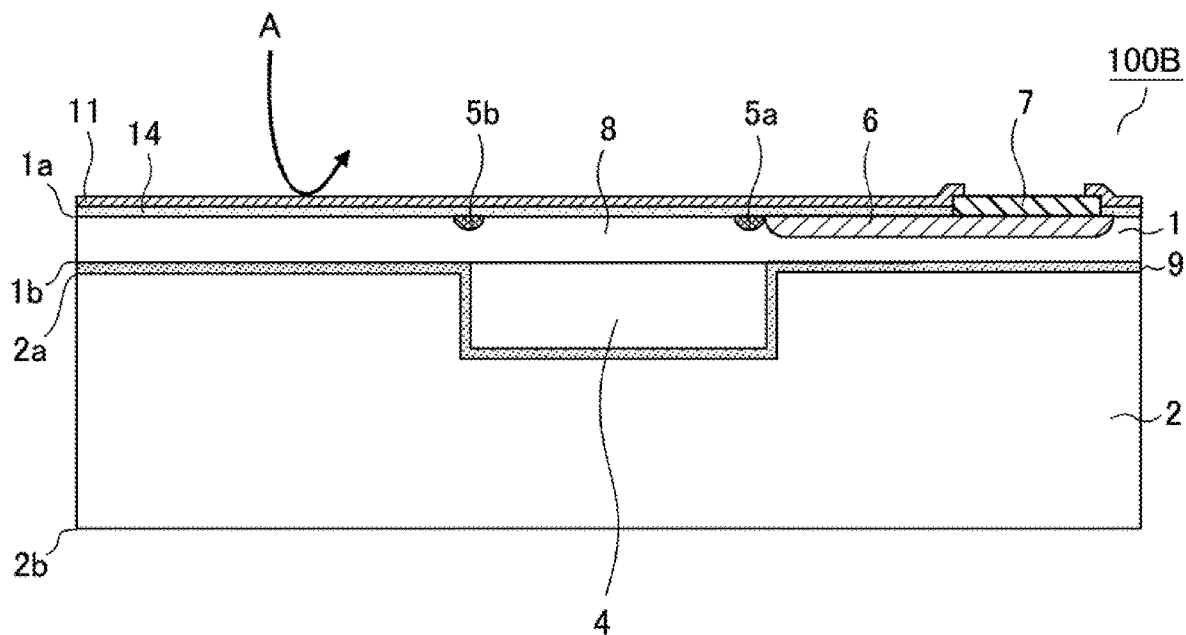
FIG. 3 is a sectional view showing a semiconductor pressure sensor element according to Third Embodiment of the invention.
Figure 4:
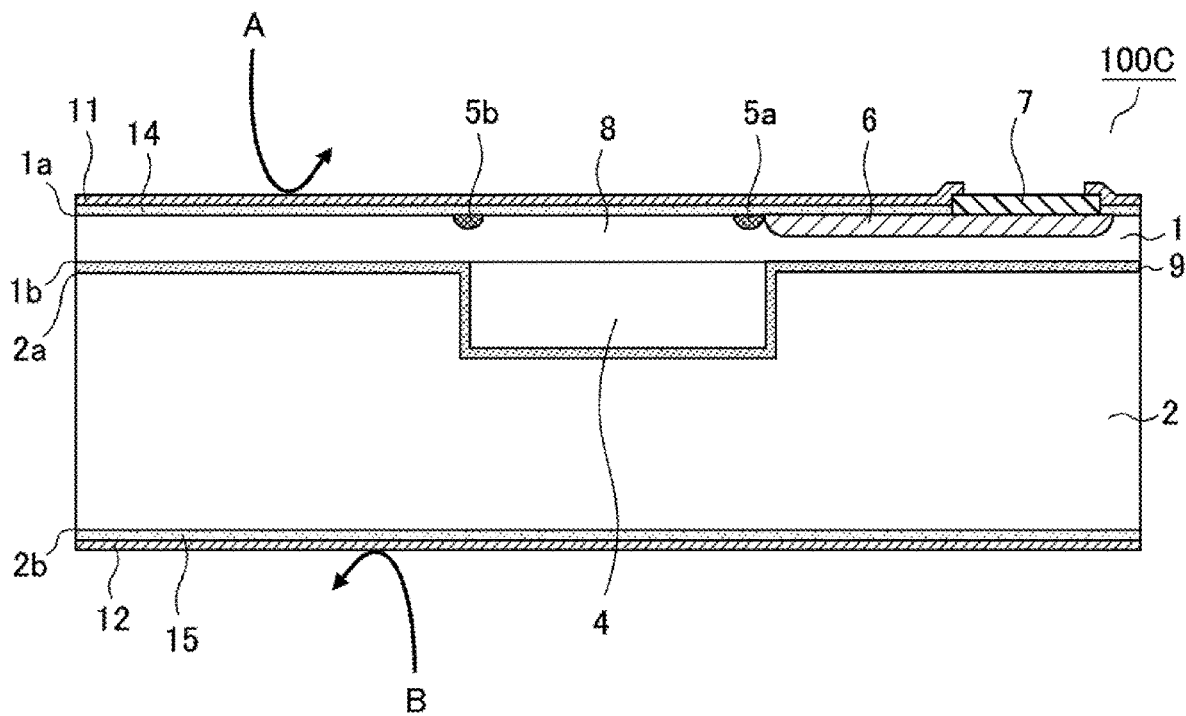
FIG. 4 is a sectional view showing the semiconductor pressure sensor element according to Third Embodiment of the invention.

FIGS. 3 and 4 show semiconductor pressure sensor elements according to Third Embodiment of the invention. Semiconductor pressure sensor elements 100B and 100C according to Third Embodiment each include, immediately below the hydrogen permeation protection film, a stress relaxation film for relaxing the tensile residual stress of the hydrogen permeation protection film. As the other components are the same as those of First Embodiment or Second Embodiment, a description thereof will be omitted.

When using a silicon nitride film ($SiN_x$) as the first hydrogen permeation protection film 11 or second hydrogen permeation protection film 12, the tensile residual stress of the silicon nitride film increases as the value x is increased in order to obtain high hydrogen permeation protection performance. Depending on a pressure range to be measured or the design of the diaphragm 8, the tension of the diaphragm 8 increases due to tensile residual stress, and the pressure detection sensitivity decreases. Also, there is the possibility that cracks are generated, or damage to the diaphragm 8 occurs in the worst case, due to a concentration of stress on the diaphragm 8.

As shown in FIGS. 3 and 4, the semiconductor pressure sensor elements 100B and 100C each include a first stress relaxation film 14, which has compressive stress, between the principal surface 1a of the first silicon substrate 1 and the first hydrogen permeation protection film 11 in order to relax the tensile residual stress of the first hydrogen permeation protection film 11. Furthermore, the semiconductor pressure sensor element 100C includes a second stress relaxation film 15, which relaxes the tensile residual stress of the second hydrogen permeation protection film. 12, between the principal surface 2b of the second silicon substrate 2 and the second hydrogen permeation protection film 12.

As the first stress relaxation film 14 and second stress relaxation film 15, a silicon oxide film is suitable. Thermal oxidation or CVD is used to form the silicon oxide film. The thickness of the silicon oxide film configuring the first stress relaxation film 14 and second stress relaxation film 15 is adjusted in accordance with the composition, residual stress, and thickness of the silicon nitride film configuring the first hydrogen permeation protection film 11 and second hydrogen permeation protection film 12, but typically, is suitably 0.05 μm to 0.3 μm.

According to the semiconductor pressure sensor elements 100B and 100C of Third Embodiment, in addition to the same advantageous effects as in First Embodiment and Second Embodiment, by providing the first stress relaxation film 14 and second stress relaxation film 15, it is possible to adjust the stress applied to the diaphragm 8, thus leading to a further improvement in measurement precision, and it is possible to prevent the generation of cracks, or the damage, due to a concentration of stress on the diaphragm 8.

Fourth Embodiment

Figure 5:
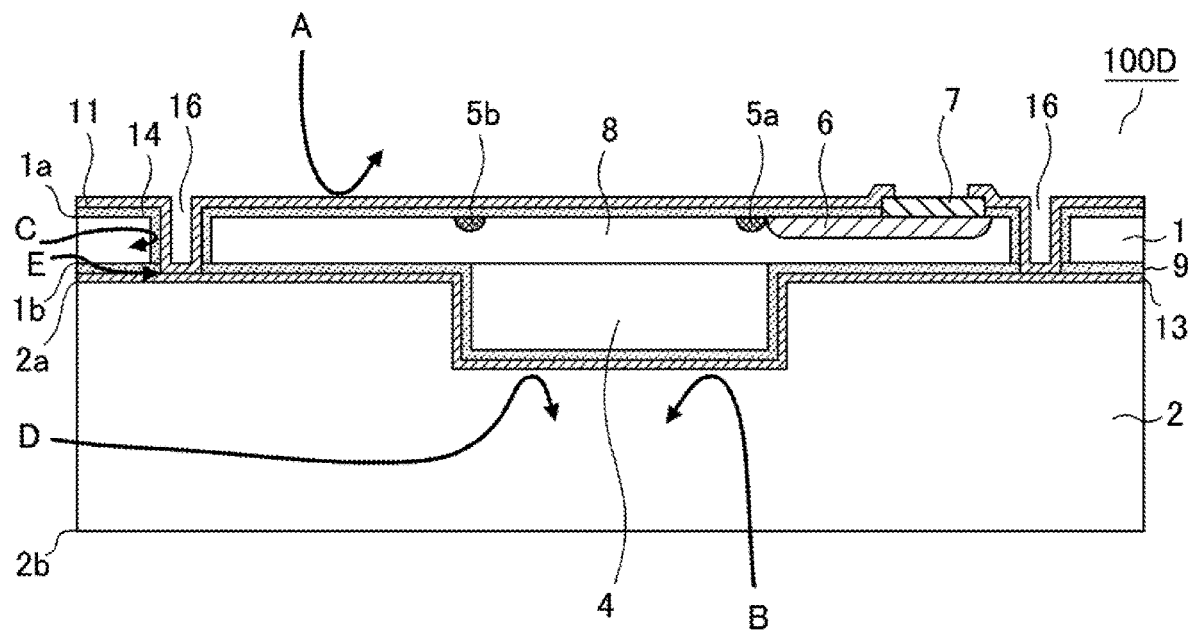
FIG. 5 is a sectional view showing a semiconductor pressure sensor element according to Fourth Embodiment of the invention.
Figure 6:
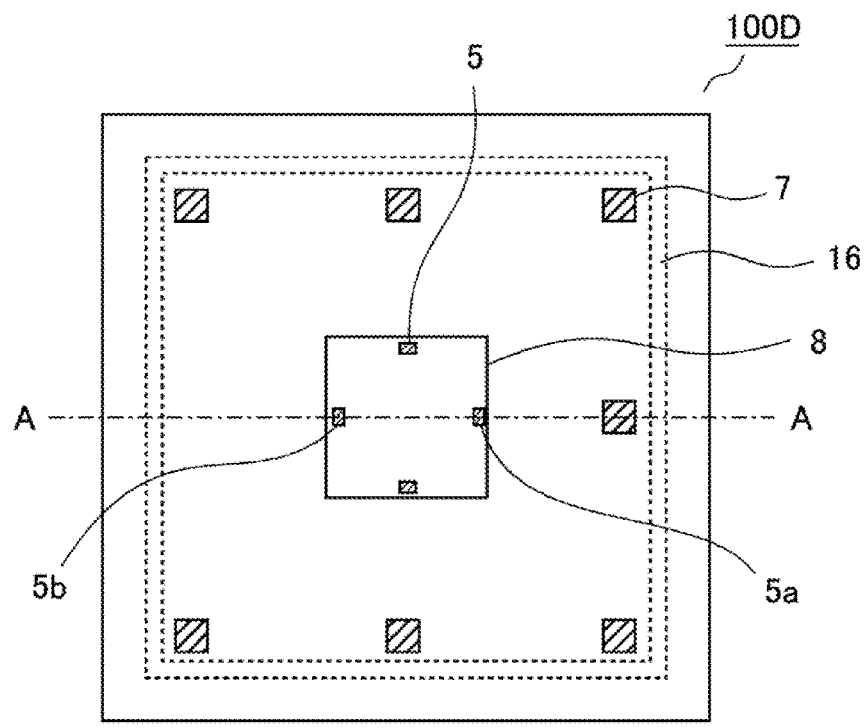
FIG. 6 is a plan showing the semiconductor pressure sensor element according to Fourth Embodiment of the invention.

FIGS. 5 and 6 show a semiconductor pressure sensor element according to Fourth Embodiment of the invention, and FIG. 5 is a sectional view of the portion shown by A-A in FIG. 6. A semiconductor pressure sensor element 100D according to Fourth Embodiment includes a third hydrogen permeation protection film 13 between the principal surface 2a of the second silicon substrate 2 and the embedded oxide film 9. Also, a trench 16 passing through from the principal surface 1a to the principal surface 1b of the first silicon substrate 1 is provided so as to surround the reference pressure chamber 4.

The first hydrogen permeation protection film 11 is provided so as to cover the inside of the trench 16, and is joined to the third hydrogen permeation protection film 13 at the bottom portion of the trench 16. As the other components are the same as those of Third Embodiment, a description thereof will be omitted.

In Second Embodiment, the permeation paths of the large hydrogen fluxes A and B from the upper and lower surfaces of the element to the reference pressure chamber 4 are blocked by the first hydrogen permeation protection film. 11 and second hydrogen permeation protection film 12 (refer to FIG. 2). In Fourth Embodiment, furthermore, the permeation paths of the hydrogen fluxes (shown by the arrows C and D in FIG. 5) to the reference pressure chamber 4 from a side surface of the element, which is exposed when the semiconductor pressure sensor elements 100D is diced into individual elements, are blocked.

As measures taken for this purpose, the third hydrogen permeation protection film 13 is provided between the principal surface 2a of the second silicon substrate 2 and the embedded oxide film 9, while the trench 16 is provided in the first silicon substrate 1 so as to surround the reference pressure chamber 4, and the first hydrogen permeation protection film 11 and the third hydrogen permeation protection film 13 are joined at the bottom portion of the trench 16. By so doing, the hydrogen permeation path from the element side surface to the reference pressure chamber 4 is blocked. Also, the permeation path of the large hydrogen flux (shown by the arrow B in FIG. 5) from the side of the principal surface 2b of the second silicon substrate 2 can also be blocked by the third hydrogen permeation protection film 13.

As the third hydrogen permeation protection film 13, silicon nitride ($SiN_x$) which, satisfying $1 \leq x \leq 4/3$, is formed by CVD or the like in the same way as in the first hydrogen permeation protection film 11 is used. Furthermore, the embedded oxide film 9 for carrying out the joining with the first silicon substrate 1 is formed on the third hydrogen permeation protection film 13 by CVD or the like in the same way. As the third hydrogen permeation protection film 13, it is also possible to use aluminum oxide ($AlO_x$) or erbium oxide ($Er_2O_3$). In either case, by forming the first hydrogen permeation protection film 11 and third hydrogen permeation protection film 13 into the same film, it is possible to efficiently manufacture the hydrogen permeation protection film at low cost.

Figure 7:
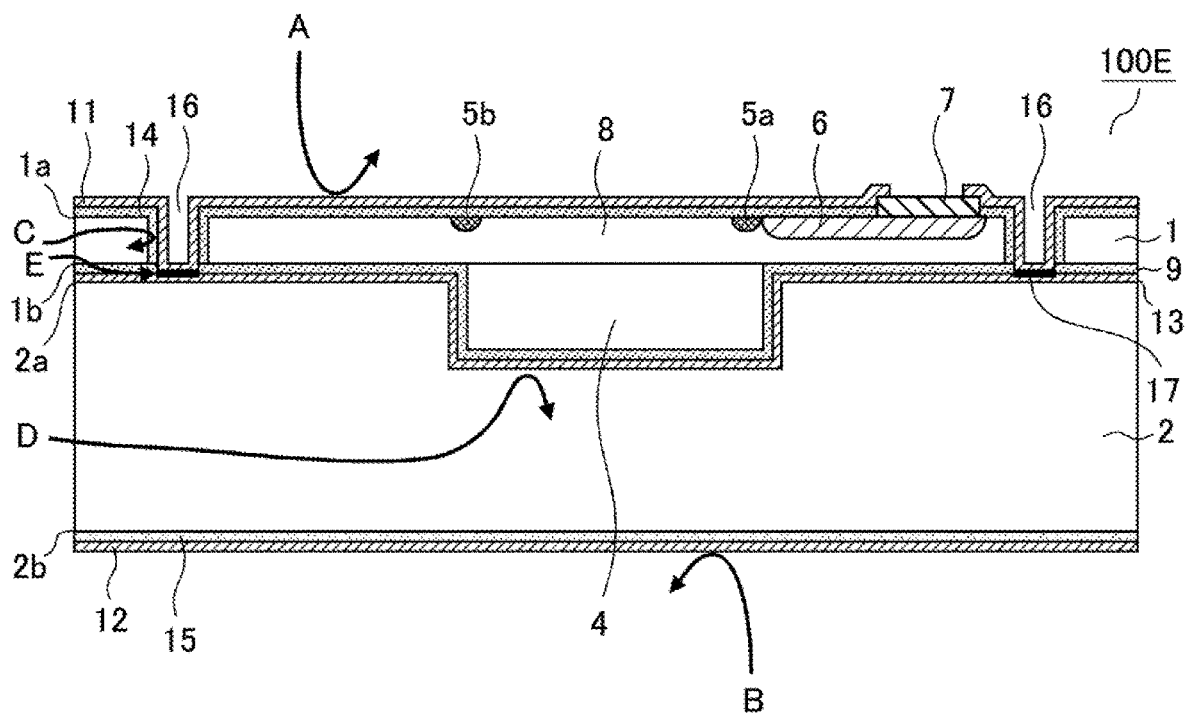
FIG. 7 is a sectional view showing the semiconductor pressure sensor element according to Fourth Embodiment of the invention.

Furthermore, as in a semiconductor pressure sensor element 100E shown in FIG. 7, by providing a joining layer 17, which is formed by mutual diffusion, at the interface of the first hydrogen permeation protection film 11 and third hydrogen permeation protection film 13, it is possible to reliably prevent the hydrogen flux shown by the arrow E in FIG. 7 from intruding from the joining interface.

When causing the trench 16 to pass through the first silicon substrate 1, first stress relaxation film 14, and embedded oxide film 9 by etching, minute roughness is generated on a surface of the third hydrogen permeation protection film 13, which is positioned at the bottom portion of the trench 16, due to manufacturing variation, and there is the possibility that the adhesion of the first hydrogen permeation protection film 11 and third hydrogen permeation protection film 13 decreases or that minute voids are generated. In this kind of case, there is fear that a minute leak path is formed at the interface of the first hydrogen permeation protection film 11 and third hydrogen permeation protection film 13 and becomes the permeation path of the hydrogen flux shown by the arrow E.

By providing the joining layer 17 shown in FIG. 7, the adhesion of the first hydrogen permeation protection film 11 and third hydrogen permeation protection film 13 is strengthened, and it is possible to prevent the formation of the leak path by the minute voids communicating with each other. Because of this, it is possible to very effectively prevent the hydrogen flux shown by the arrow E from diffusing through the joining interface and intruding into the reference pressure chamber 4.

When the first hydrogen permeation protection film 11 and the third hydrogen permeation protection film 13 are a silicon nitride film, the films 11 and 13 diffuse mutually by being heat treated, thus forming the joining layer 17. However, the first hydrogen permeation protection film 11 and the third hydrogen permeation protection film 13 may be made of different materials, and furthermore, may be each configured of a plurality of types of films. Also, the second hydrogen permeation protection film 12 and the second stress relaxation film 15 are not provided in the example shown in FIG. 5, but may be provided.

According to the semiconductor pressure sensor elements 100D and 100E according to Fourth Embodiment, in addition to the same advantage effects as in First to Third Embodiments, by three-dimensionally enclosing the reference pressure chamber 4 with the first hydrogen permeation protection film 11 and third hydrogen permeation protection film 13, it is possible to effectively prevent the intrusion of hydrogen from not only the upper and lower surfaces, but the side surface, of the element, leading to a further improvement in measurement precision.

Fifth Embodiment

Figure 8:
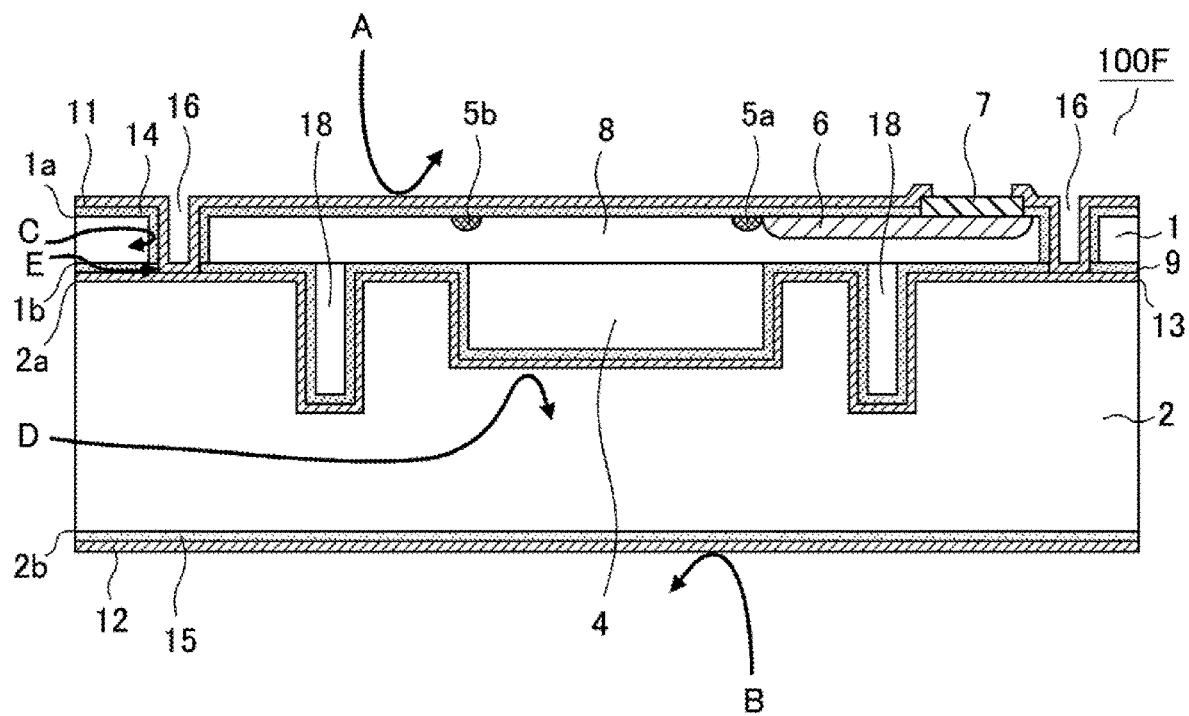
FIG. 8 is a sectional view showing a semiconductor pressure sensor element according to Fifth Embodiment of the invention.
Figure 9:
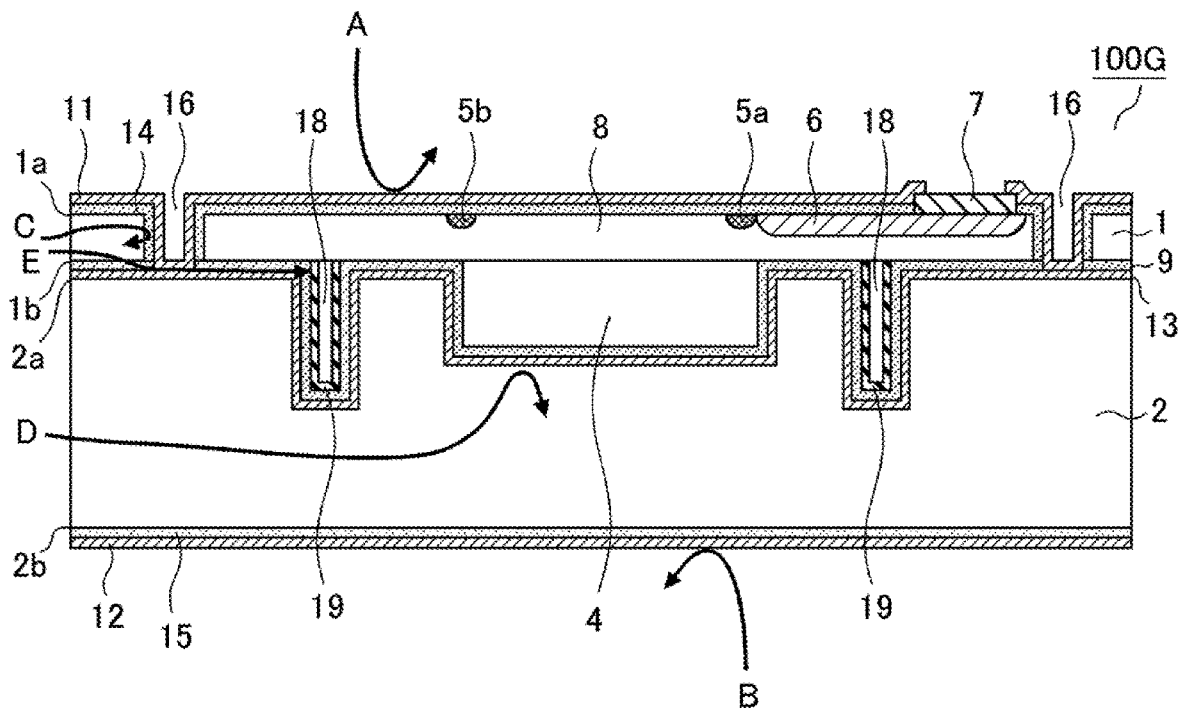
FIG. 9 is a sectional view showing the semiconductor pressure sensor element according to Fifth Embodiment of the invention.

FIGS. 8 and 9 show semiconductor pressure sensor elements according to Fifth Embodiment of the invention. Semiconductor pressure sensor elements 100F and 100G according to Fifth Embodiment each include a hydrogen storage chamber 18 which has a frame-like depressed portion provided in the principal surface 2a of the second silicon substrate 2 so as to surround the reference pressure chamber 4, and which is formed of a space enclosed by the frame-like depressed portion and the principal surface 1b of the first silicon substrate 1. As the other components are the same as those of Fourth Embodiment, a description thereof will be omitted.

In Fourth Embodiment, the intrusion of hydrogen from the upper and lower surfaces, and the side surface, of the element is prevented by three-dimensionally enclosing the reference pressure chamber 4 with the first hydrogen permeation protection film 11 and the third hydrogen permeation protection film 13 (and second hydrogen permeation protection film 12). When hydrogen still intrudes for some reason, the hydrogen can be trapped before reaching the reference pressure chamber 4 by providing the hydrogen storage chamber 18.

For example, even when the hydrogen flux shown by the arrow E in FIG. 8 permeates the joining interface of the first hydrogen permeation protection film 11 and third hydrogen permeation protection film 13, the hydrogen flux, being trapped by the hydrogen storage chamber 18, cannot intrude into the reference pressure chamber 4 in the back.

The hydrogen storage chamber 18 may be formed at the same time when forming the reference pressure chamber 4 by etching the second silicon substrate 2, or may be separately formed when increasing the volume of the hydrogen storage chamber 18 to increase the amount of hydrogen which can be trapped. However, when the hydrogen storage chamber 18 large in volume is provided, there is fear that joining strength deteriorates due to a decrease in the joining area of the first silicon substrate 1 and second silicon substrate 2.

Therefore, when intending to suppress a decrease in the joining area of the first silicon substrate 1 and second silicon substrate 2 and increase the amount of hydrogen which can be trapped, it is effective to provide a hydrogen storage film 19 of a hydrogen storage material inside the hydrogen storage chamber 18 as in the semiconductor pressure sensor element 100G shown in FIG. 9.

As the hydrogen storage film 19, it is possible to use an alloy consisting mainly of a transition metal, such as titanium (Ti), nickel (Ni), iridium (Ir), zirconium (Zr), or palladium (Pd), or an alloy consisting mainly of magnesium (Mg). A first transition metal-based alloy of titanium, nickel, or the like is inexpensive, and a second transition metal-based alloy of zirconium, palladium, or the like is more expensive than the first transition metal-based alloy but high in hydrogen capture efficiency.

Also, a magnesium alloy can capture a large amount of hydrogen gas in the operating temperature range of a fuel cell stack used in a fuel cell vehicle. In an automobile fuel cell system, the fuel cell stack is cooled, and in general, the operating temperature is controlled so as not to exceed 100° C. These hydrogen storage films 19 can all be formed by a versatile film formation method in a semiconductor wafer process such as sputtering.

According to the semiconductor pressure sensor elements 100F and 100G of Fifth Embodiment, in addition to the same advantageous effects as in First to Fourth Embodiments, as it is possible to trap the hydrogen having intruded into the element by providing the hydrogen storage chamber 18 so as to surround the reference pressure chamber 4, it is possible to reliably prevent the intrusion of hydrogen into the reference pressure chamber 4, leading to a further improvement in measurement precision.

Sixth Embodiment

Figure 10:
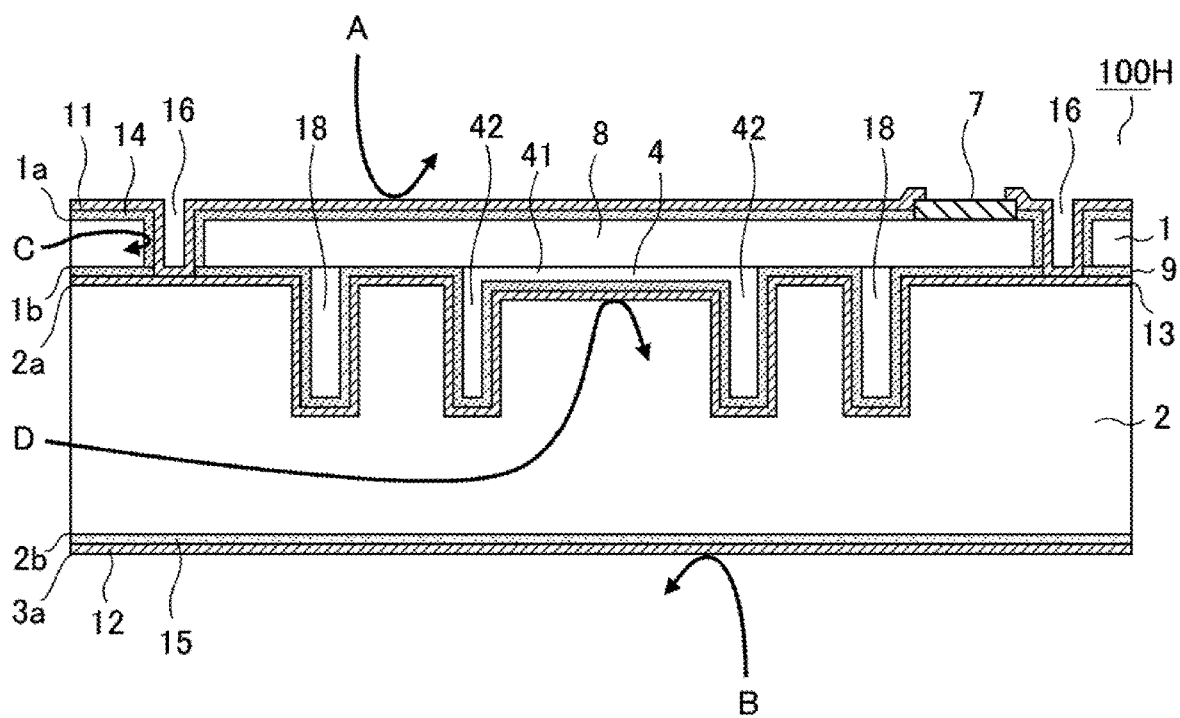
FIG. 10 is a sectional view showing a semiconductor pressure sensor element according to Sixth Embodiment of the invention.

FIG. 10 shows a semiconductor pressure sensor element according to Sixth Embodiment of the invention. In First to Fifth Embodiments, a description is given, as an example, of a piezoresistor type semiconductor pressure sensor element, but in Sixth Embodiment of the invention, a description will be given of a capacitance type semiconductor pressure sensor element 100H which converts a change in pressure applied to the diaphragm 8 to a change in capacitance.

The first silicon substrate 1 has the diaphragm 8 which is a movable electrode which changes in shape by receiving the applied pressure. The second silicon substrate 2 which is a fixed electrode includes the reference pressure chamber 4 opposite to the diaphragm 8. The reference pressure chamber 4 has a first depressed portion 41, which is shallowly formed in order for the first silicon substrate 1 and the second silicon substrate 2 to form capacitance, and a second depressed portion 42 formed around the first depressed portion 41 so as to be deeper than the first depressed portion 41.

In order to measure pressure with high precision, it is preferable that the distance between the diaphragm 8, which is the movable electrode, and the second silicon substrate 2, which is the fixed electrode, is small. On the other hand, when the volume of the reference pressure chamber 4 is small, internal pressure fluctuation increases significantly when hydrogen intrudes into the reference pressure chamber 4, leading to an increase in output fluctuation. Therefore, by forming the second depressed portion 42 by etching one portion of the reference pressure chamber 4 deeply, it is possible to secure the volume of the reference pressure chamber 4 while maintaining the capacitance. Also, the capacitance type semiconductor pressure sensor element 100H is such that as the distance between the movable electrode and the fixed electrode is small, there is a stopper effect that when an excess pressure is applied, the movable electrode comes into contact with the fixed electrode, thus suppressing the amount of bending of the diaphragm 8, and it is possible to prevent damage to the diaphragm 8.

Also in Sixth Embodiment, the permeation path of the hydrogen flux shown by the arrow A in FIG. 10 is blocked by providing the first hydrogen permeation protection film 11 on the side of the principal surface 1a of the first silicon substrate 1. Also, the permeation path of the hydrogen flux shown by the arrow B in FIG. 10 is blocked by providing the second hydrogen permeation protection film 12 on the side of the principal surface 2b of the second silicon substrate 2. Furthermore, the permeation path of the hydrogen flux shown by the arrow C in FIG. 10 is blocked by providing the trench 16 in the first silicon substrate 1 so as to surround the reference pressure chamber 4 and joining the first hydrogen permeation protection 11 and third hydrogen permeation protection film 13 at the bottom portion of the trench 16.

Furthermore, by providing the hydrogen storage chamber 18 so as to surround the reference pressure chamber 4, it is possible to trap hydrogen before the hydrogen reaches the reference pressure chamber 4 even when the hydrogen intrudes for some reason. Also, by providing the first stress relaxation film 14 and second stress relaxation film 15, it is possible to adjust the stress applied to the diaphragm 8. In this way, also in the capacitance type semiconductor pressure sensor element 100H according to Sixth Embodiment, it is possible to obtain the same advantageous effects as in First to Fifth Embodiments.

Seventh Embodiment

Figure 11:
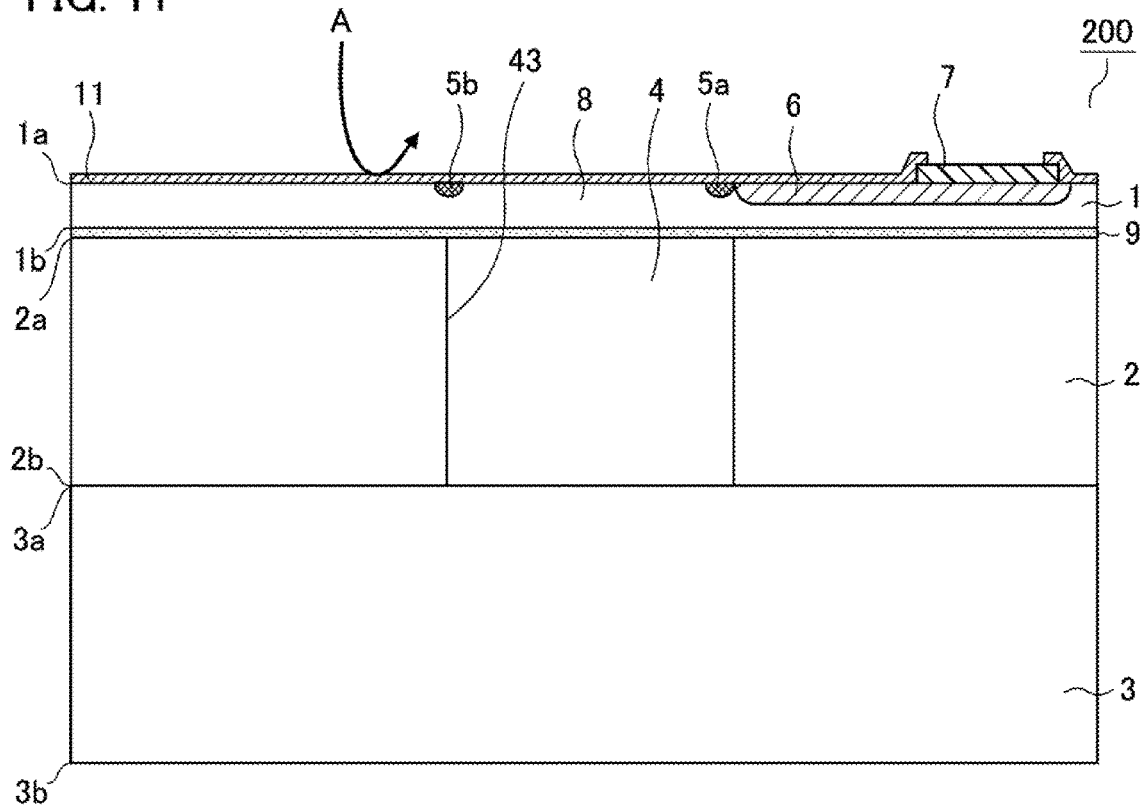
FIG. 11 is a sectional view showing a semiconductor pressure sensor element according to Seventh Embodiment of the invention.
Figure 12:
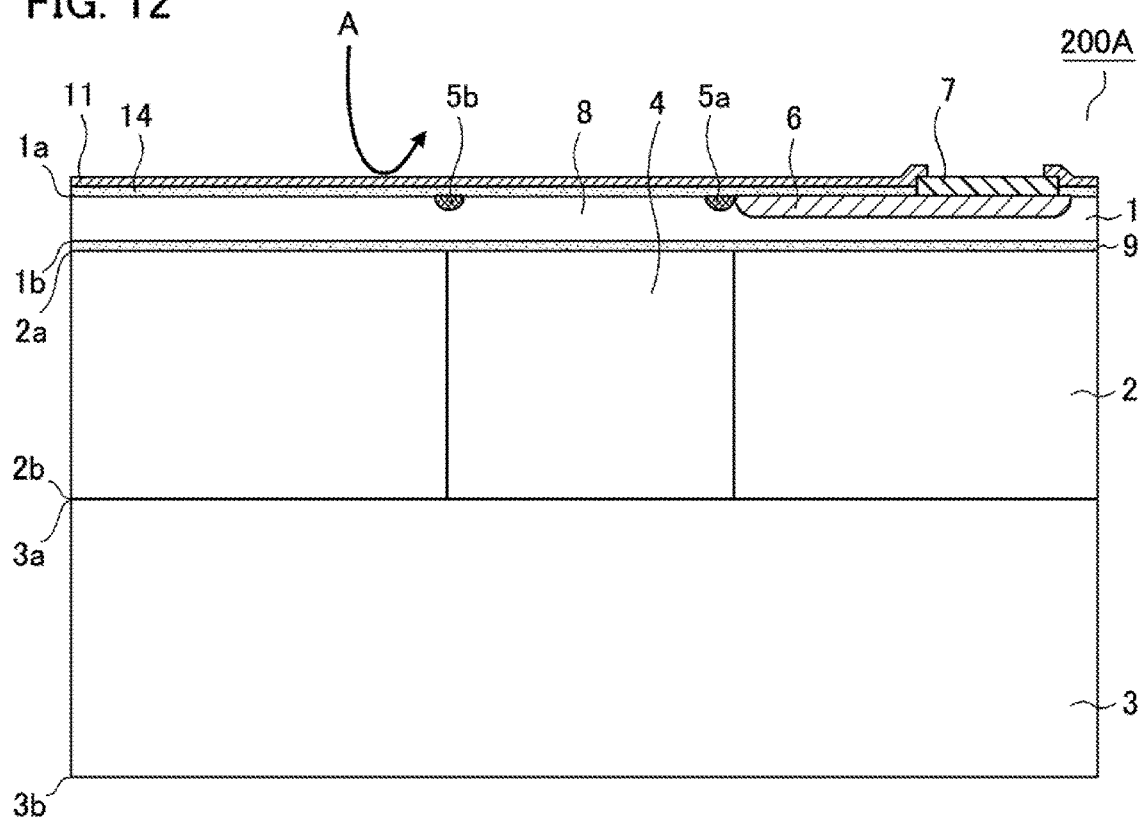
FIG. 12 is a sectional view showing the semiconductor pressure sensor element according to Seventh Embodiment of the invention.

FIGS. 11 and 12 show semiconductor pressure sensor elements according to Seventh Embodiment of the invention. Semiconductor pressure sensor elements 200 and 200A according to Seventh Embodiment, which measure the pressure of a hydrogen gas supplied to a fuel cell in a fuel cell system, each includes the first silicon substrate 1 having one principal surface 1a and the other principal surface 1b, which are opposite to each other, the second silicon substrate 2 having one principal surface 2a and the other principal surface 2b, which are opposite to each other, and a third silicon substrate 3 having one principal surface 3a and another principal surface 3b, which are opposite to each other, as shown in FIG. 11.

The semiconductor pressure sensor element 200 has the diaphragm 8, which is a pressure receiving portion, in the first silicon substrate 1. The semiconductor pressure sensor element 200 has, around the diaphragm 8, the piezoresistors 5a and 5b (collectively called piezoresistors 5) which convert pressure applied to the diaphragm 8 to an electrical signal. FIG. 11 shows two piezoresistors 5a and 5b, but actually, there are four piezoresistors 5. Also, the diffusion wiring layer 6 and the metal electrode film 7 are provided, and furthermore, the first hydrogen permeation protection film 11 is provided, on the side of the principal surface 1a of the first silicon substrate 1.

The second silicon substrate 2 has a hole portion 43 passing through from the principal surface 2a to the principal surface 2b, and the principal surface 2a is joined to the principal surface 1b of the first silicon substrate 1 via the embedded oxide film 9. Also, the principal surface 3a of the third silicon substrate 3 is joined to the principal surface 2b of the second silicon substrate 2. The reference pressure chamber 4, the space of which, enclosed by the hole portion 43 of the second silicon substrate 2, the principal surface 1b of the first silicon substrate 1, and the principal surface 3a of the third silicon substrate 3, is brought into a vacuum state, serves as a reference based on which to measure absolute pressure.

When pressure is applied to the diaphragm 8 by a hydrogen gas which is a gas to be measured, the diaphragm 8 bends, and the resistance value of the piezoresistors 5 changes. The piezoresistors 5 convert the resistance value change to an electrical signal and outputs the electrical signal, and the output electrical signal is taken out to the external from the metal electrode film 7 via the diffusion wiring layer 6.

A brief description will be given of a method of manufacturing the semiconductor pressure sensor element 200. Firstly, an SOI wafer wherein the first silicon substrate 1 and the second silicon substrate 2 are joined via the embedded oxide film 9 is fabricated. There are some SOI wafer manufacturing methods, but because of the controllable thickness and resistivity, less crystal defects, or the like, of the first silicon substrate 1 forming an active layer, it is preferable to use a bonded SOI wafer wherein the first silicon substrate 1 and the second silicon substrate 2 are joined with the embedded oxide film 9.

Next, etching is carried out from the side of the principal surface 2a of the second silicon substrate 2, passing through the second silicon substrate 2, to the embedded oxide film 9, thus forming the diaphragm 8. At this time, as the embedded oxide film 9 functions as an etching stopper by using an inductive coupled plasma-reactive ion etching using the Bosch process, it is possible to control the shape and thickness of the diaphragm 8, which have effects on pressure measurement precision, with high precision. However, an etching method is not limited to this, and the diaphragm 8 may be formed by wet anisotropic etching using an etching liquid such as potassium hydroxide (KOH) or tetramethylammonium hydroxide (TMAH).

Subsequently, the principal surface 2b of the second silicon substrate 2 and the principal surface 3a of the third silicon substrate 3 are joined in a vacuum, thus forming the reference pressure chamber 4. As a joining method, for example, a surface activation joining method whereby after the joining surface of the second silicon substrate 2 and third silicon substrate 3 is irradiated with an ion beam or neutral atom beam and activated, a constant load is applied to the joining surface, is suitable. According to the method, it is possible to implement the joining at room temperature without having to raise the temperature when joining.

Subsequently, after the piezoresistors 5 and the diffusion wiring layer 6 are formed around the diaphragm 8 by ion implantation and the subsequent heat treatment or the like, Al, Al—Si, Al—Si—Cu, or the like, is formed into a film by a method such as sputtering, thus forming the metal electrode film 7. Furthermore, the first hydrogen permeation protection film 11 is formed on the side of the principal surface 1a of the first silicon substrate 1, thus obtaining the semiconductor pressure sensor element 200 shown in FIG. 11.

As the first hydrogen permeation protection film 11, a silicon nitride film ($SiN_x$) which can be formed by a film formation method, such as a versatile chemical vapor deposition (CVD), is suitable in a semiconductor wafer process. The silicon nitride film, as it is large in residual tensile stress, is preferably thin in order to suppress the effect on the characteristics and reliability of the sensor. Meanwhile, a certain amount of thickness is necessary to prevent the intrusion of hydrogen into the reference pressure chamber 4. Because of this, the thickness of the silicon nitride film is set to 0.01 μm or more and preferably selected in a range of 0.04 μm to 0.2 μm.

An index x representing the composition ratio of silicon atoms and nitrogen atoms of the silicon nitride film ($SiN_x$) can take values from 0 to 4/3 in theory. When x is 4/3, of the values, which is the maximum value, the silicon nitride film has a stoichiometric composition ratio, and is expressed as $Si_3N_4$. When at this composition ratio, all bonds are a Si—N bond, which is an atomic arrangement wherein $Si_3N_4$ is most densely filled with silicon atoms and nitrogen atoms. As silicon atoms and nitrogen atoms are different in atom size, in the case of $Si_3N_4$ which is most densely filled with silicon atoms and nitrogen atoms, no void which hydrogen atoms permeate exists, and hydrogen permeation protection performance is highest.

As opposed to this, as the value x becomes smaller than 4/3, the bonds of silicon atoms (Si—Si) increase. When silicon atoms of the same size bond, the atom arrangement is not of a structure which is most densely filled with silicon atoms and nitrogen atoms, voids larger than the size of hydrogen atoms are generated. The smaller the value x, the larger the voids, and the voids communicate with each other, thus forming leak paths which hydrogen atoms permeate.

In particular, when the value x is ½ or less, the network of the leak paths is three-dimensionally configured, leading to a complete loss of the hydrogen permeation protection performance. Owing to the above kinds of characteristics, by the value x representing the composition ratio of silicon atoms and nitrogen atoms of the silicon nitride film satisfying $1 \le x \le 4/3$, and by securing a fixed film thickness of the heretofore described kind, it is possible to obtain effective hydrogen permeation protection performance.

The first hydrogen permeation protection film 11 is not limited to the silicon nitride film, and it is also possible to use an aluminum oxide film ($AlO_x$) which is a material high in the affinity with the semiconductor wafer process. The thickness of the first hydrogen permeation protection film 11 is suitably in a range of 0.04 μm to 0.2 μm which is equal to that of the silicon nitride film. In particular, $Al_2O_3$, of aluminum oxide films, is on the order of four digits smaller in hydrogen permeation coefficient than at least SUS316, although depending on the temperature. The aluminum oxide film can be formed by sputtering, CVD, or the like.

As the aluminum oxide film has good step coverage, it is possible to obtain high hydrogen permeation protection performance without generating a void even in the case of a structure with steps. Meanwhile, aluminum oxide is such that pinholes, microcracks, or the like are likely to be generated, and that the management of crystallinity is important in order to obtain effective hydrogen permeation protection performance.

Also, as the first hydrogen permeation protection film 11, it is also possible to use an erbium oxide film ($Er_2O_3$) still lower in hydrogen permeation coefficient. Erbium belongs to rare earth, but can be formed into a film by vacuum arc deposition, metal organic decomposition (MOD), metal organic chemical vapor deposition (MOCVD), or the like. By using the erbium oxide film, it is possible to obtain hydrogen permeation protection performance still higher than when using the aluminum oxide film.

Also, the semiconductor pressure sensor element 200A shown in FIG. 12 includes the first stress relaxation film 14, which has compressive stress, between the principal surface 1a of the first silicon substrate 1 and the first hydrogen permeation protection film 11 in order to relax the tensile residual stress of the first hydrogen permeation protection film 11. As the first stress relaxation film 14, a silicon oxide film is suitable. Thermal oxidation or CVD is used to form the silicon oxide film. The thickness of the silicon oxide film configuring the first stress relaxation film 14 is adjusted in accordance with the composition, residual stress, and thickness of the silicon nitride film configuring the first hydrogen permeation protection film 11, but typically, is suitably 0.05 μm to 0.3 μm.

In the semiconductor pressure sensor element 200 according to Seventh Embodiment, as the area on the front surface side of the diaphragm 8 exposed to hydrogen is largest, and the permeation distance from the front surface side of the diaphragm 8 to the reference pressure chamber 4 is shortest, it is conceivable that the front surface side of the diaphragm 8 becomes the permeation path of the large hydrogen flux shown by the arrow A in FIG. 11. In Seventh Embodiment, the hydrogen permeation path from the front surface side of the diaphragm 8 to the reference pressure chamber 4 is blocked by providing the first hydrogen permeation protection film 11 on the side of the principal surface 1a of the first silicon substrate 1.

Also, the first hydrogen permeation protection film 11 can be formed by a heretofore known semiconductor wafer process. Furthermore, by providing the first stress relaxation film 14 immediately below the first hydrogen permeation protection film 11, as in the semiconductor pressure sensor element 200A shown in FIG. 12, it is possible to adjust the stress applied to the diaphragm 8, thus leading to a further improvement in measurement precision, and it is possible to prevent the generation of cracks, or the damage, due to a concentration of stress on the diaphragm 8.

For these reasons, according to Seventh Embodiment, by providing the first hydrogen permeation protection film 11, it is possible to effectively prevent the intrusion of hydrogen into the reference pressure chamber 4 from the side of the principal surface 1a of the first silicon substrate 1, and it is possible to obtain the semiconductor pressure sensor elements 200 and 200A which are inexpensive and high in measurement precision.

Also, as the reference pressure chamber 4 passes through the second silicon substrate 2, it is possible to increase the volume of the reference pressure chamber 4 compared with in the semiconductor pressure sensor element 100 according to First Embodiment. Consequently, it is possible to obtain the semiconductor pressure sensor element 200 which can keep down a rise in the pressure of the reference pressure chamber 4 even in the event that hydrogen intrudes into the reference pressure chamber 4 and which is thus small in characteristic fluctuation.

Eighth Embodiment

Figure 13:
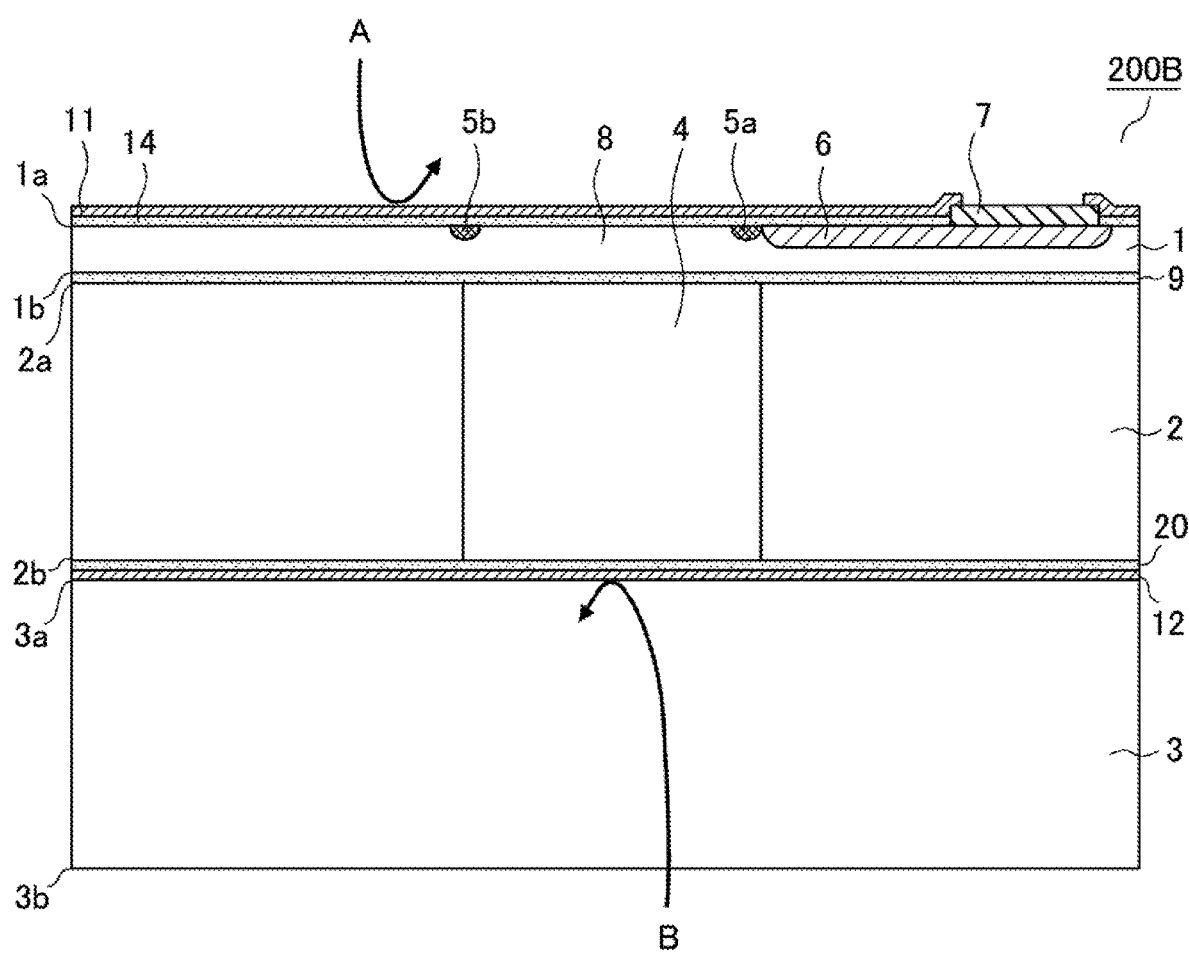
FIG. 13 is a sectional view showing a semiconductor pressure sensor element according to Eighth Embodiment of the invention.

FIG. 13 shows a semiconductor pressure sensor element according to Eighth Embodiment of the invention. A semiconductor pressure sensor element 200B according to Eighth Embodiment includes, in addition to the same components as those of the semiconductor pressure sensor element 200A (FIG. 12) according to Seventh Embodiment, the second hydrogen permeation protection film 12 provided between the principal surface 2b of the second silicon substrate 2 and the principal surface 3a of the third silicon substrate 3. As the other components are the same as those of Seventh Embodiment, a description thereof will be omitted.

As the area on the side of the principal surface 3b of the third silicon substrate 3 exposed to hydrogen is also equal to that on the front surface side of the diaphragm 8, it is conceivable that the side of the principal surface 3b of the third silicon substrate 3 becomes the permeation path of the large hydrogen flux shown by the arrow B in FIG. 13. However, as the distance from the principal surface 3b of the third silicon substrate 3 to the reference pressure chamber 4 is at least about 600 μm, and the thickness of the first silicon substrate 1 is about 10 μm to 20 μm, it takes a time 30 to 60 times longer than from the front surface side of the diaphragm 8 in order for hydrogen, which has permeated from the side of the principal surface 3b of the third silicon substrate 3, to reach the reference pressure chamber 4. However, even though there is a time delay for the hydrogen to reach the reference pressure chamber 4, the fact remains that the hydrogen still permeates.

The semiconductor pressure sensor element 200B is mounted on a base material, via a die bonding agent (neither the material nor the agent is shown), on the principal surface 3b of the third silicon substrate 3. Because of this, the principal surface 3b is covered with the die bonding agent, but the die bonding agent has no hydrogen permeation protection performance. Therefore, in Eighth Embodiment, before joining the second silicon substrate 2 and third silicon substrate 3, the second hydrogen permeation protection film 12 is provided on the principal surface 3a of the third silicon substrate 3, thereby blocking the hydrogen permeation path from the side of the principal surface 3b of the third silicon substrate 3 to the reference pressure chamber 4.

As the second hydrogen permeation protection film 12, silicon nitride ($SiN_x$), which satisfies $1 \leq x \leq 4/3$ in the same way as in the first hydrogen permeation protection film 11, aluminum oxide ($AlO_x$), or erbium oxide ($Er_2O_3$) is used. By forming the first hydrogen permeation protection film 11 and second hydrogen permeation protection film 12 into the same film, it is possible to efficiently manufacture the hydrogen permeation protection film at low cost. When a silicon nitride film is used as the second hydrogen permeation protection film 12, there is a case in which no sufficient joining strength can be obtained when joining the second silicon substrate 2 and third silicon substrate 3, meaning that it is preferable to form a silicon oxide film 20 using CVD or the like.

According to the semiconductor pressure sensor element 200B of Eighth Embodiment, in addition to the same advantageous effects as in Seventh Embodiment, by providing the second hydrogen permeation protection film 12, it is possible to prevent the intrusion of hydrogen into the reference pressure chamber 4 from the side of the principal surface 3b of the third silicon substrate 3, leading to a further improvement in measurement precision.

Ninth Embodiment

Figure 14:
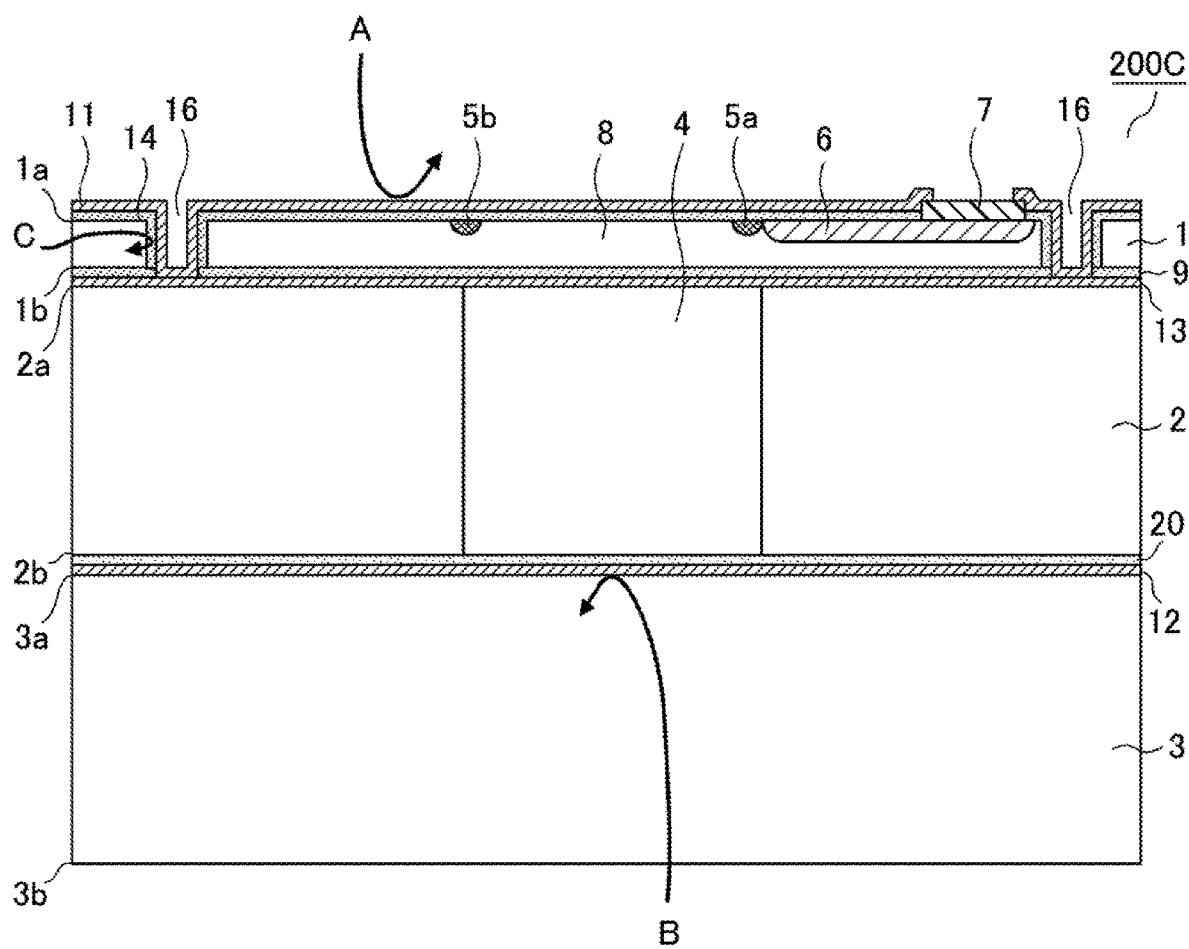
FIG. 14 is a sectional view showing a semiconductor pressure sensor element according to Ninth Embodiment of the invention.
Figure 15:
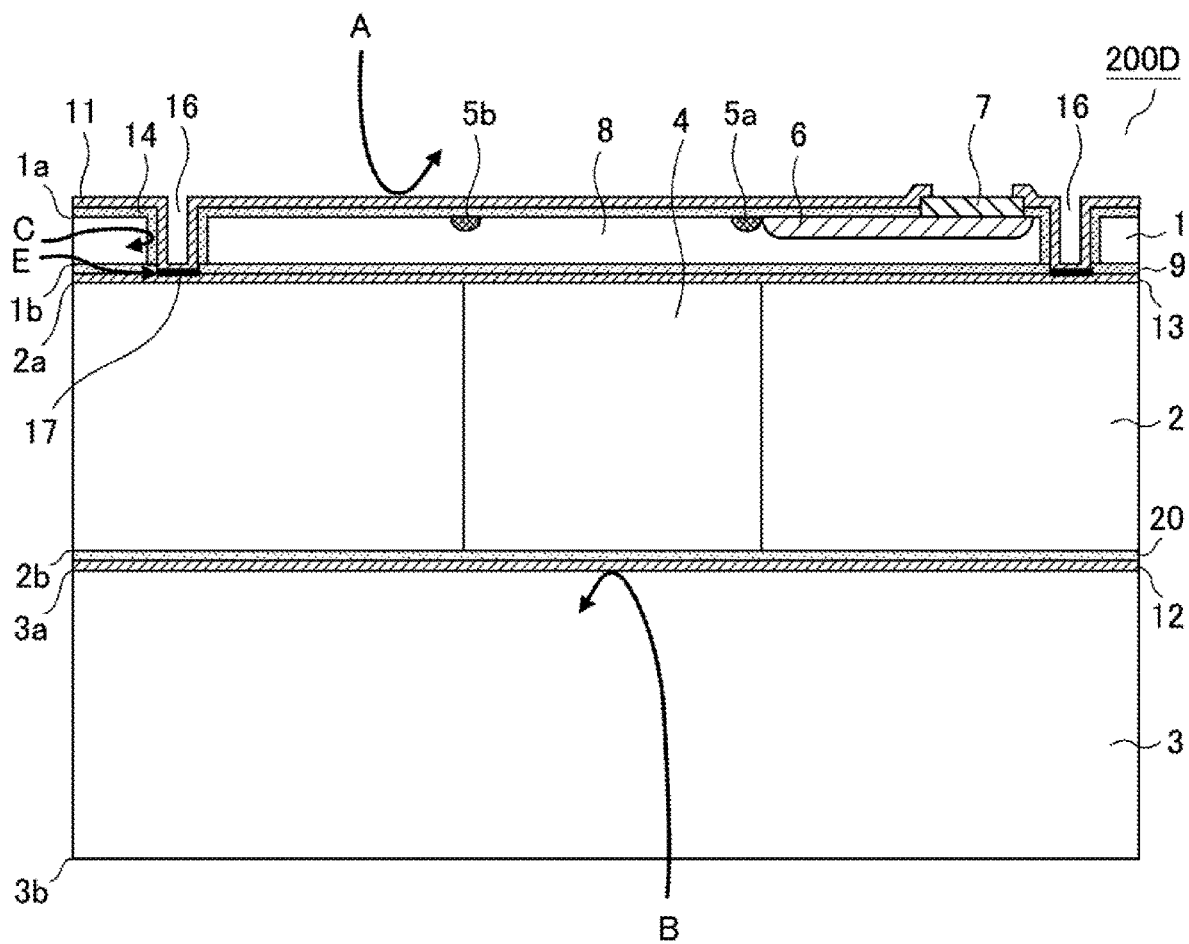
FIG. 15 is a sectional view showing the semiconductor pressure sensor element according to Ninth Embodiment of the invention.

FIGS. 14 and 15 show a semiconductor pressure sensor element according to Ninth Embodiment of the invention. Semiconductor pressure sensor elements 200C and 200D according to Ninth Embodiment each include the third hydrogen permeation protection film 13 between the principal surface 2a of the second silicon substrate 2 and the embedded oxide film 9. Also, the trench 16 passing through from the principal surface 1a to the principal surface 1b of the first silicon substrate 1 is provided so as to surround the reference pressure chamber 4.

The first hydrogen permeation protection film 11 is provided so as to cover the inside of the trench 16, and is joined to the third hydrogen permeation protection film 13 at the bottom portion of the trench 16. As the other components are the same as those of Eighth Embodiment, a description thereof will be omitted.

In Eighth Embodiment, the permeation paths of the large hydrogen fluxes A and B from the upper and lower surfaces of the element to the reference pressure chamber 4 are blocked by the first hydrogen permeation protection film. 11 and second hydrogen permeation protection film. 12 (refer to FIG. 13). In Ninth Embodiment, furthermore, the permeation path of the hydrogen flux (shown by the arrow C in FIG. 14) to the reference pressure chamber 4 from a side surface of the element, which is exposed when the semiconductor pressure sensor elements 200C is diced into individual elements, is blocked.

As measures taken for this purpose, the third hydrogen permeation protection film 13 is provided between the principal surface 2a of the second silicon substrate 2 and the embedded oxide film 9, while the trench 16 is provided in the first silicon substrate 1 so as to surround the reference pressure chamber 4, and the first hydrogen permeation protection film 11 and the third hydrogen permeation protection film 13 are joined at the bottom portion of the trench 16. By so doing, the hydrogen permeation path from the element side surface to the reference pressure chamber 4 is blocked.

As the third hydrogen permeation protection film 13, silicon nitride ($SiN_x$) which, satisfying $1 \leq x \leq 4/3$, is formed by CVD or the like in the same way as in the first hydrogen permeation protection film 11 is used. Furthermore, the embedded oxide film 9 for carrying out the joining with the first silicon substrate 1 is formed on the third hydrogen permeation protection film 13 by CVD or the like in the same way.

As the third hydrogen permeation protection film 13, it is also possible to use aluminum oxide ($AlO_x$) or erbium oxide ($Er_2O_3$). In either case, by forming the first hydrogen permeation protection film 11 and third hydrogen permeation protection film 13 into the same film, it is possible to efficiently manufacture the hydrogen permeation protection film at low cost.

Furthermore, by providing the joining layer 17, which is formed by mutual diffusion, at the interface of the first hydrogen permeation protection film 11 and third hydrogen permeation protection film 13, at the bottom portion of the trench 16, as in the semiconductor pressure sensor element 200D shown in FIG. 15, it is possible to reliably prevent the hydrogen flux shown by the arrow E in FIG. 15 from intruding from the joining interface.

When causing the trench 16 to pass through the first silicon substrate 1, first stress relaxation film 14, and embedded oxide film 9 by etching, minute roughness is generated on a surface of the third hydrogen permeation protection film 13, which is positioned at the bottom portion of the trench 16, due to manufacturing variation, and there is the possibility that the adhesion of the first hydrogen permeation protection film 11 and third hydrogen permeation protection film 13 decreases, or that minute voids are generated. In this kind of case, there is fear that a minute leak path is formed at the interface of the first hydrogen permeation protection film 11 and third hydrogen permeation protection film 13 and becomes the permeation path of the hydrogen flux shown by the arrow E.

By providing the joining layer 17 shown in FIG. 15, the adhesion of the first hydrogen permeation protection film 11 and third hydrogen permeation protection film 13 is strengthened, and it is possible to prevent the formation of a leak path by minute voids communicating with each other. Because of this, it is possible to very effectively prevent the hydrogen flux shown by the arrow E from diffusing through the joining interface and intruding into the reference pressure chamber 4.

When the first hydrogen permeation protection film 11 and the third hydrogen permeation protection film 13 are a silicon nitride film, the films 11 and 13 diffuse mutually by being heat treated, thus forming the joining layer 17. However, the first hydrogen permeation protection film 11 and the third hydrogen permeation protection film 13 may be made of different materials, and furthermore, may be each configured of a plurality of types of films.

According to the semiconductor pressure sensor elements 200C and 200D of Ninth Embodiment, in addition to the same advantage effects as in Seventh and Eighth Embodiments, by joining the third hydrogen permeation protection film 13 to the first hydrogen permeation protection film 11 at the bottom portion of the trench 16, it is possible to prevent the intrusion of hydrogen from the element side surface, leading to a further improvement in measurement precision.

Tenth Embodiment

Figure 16:
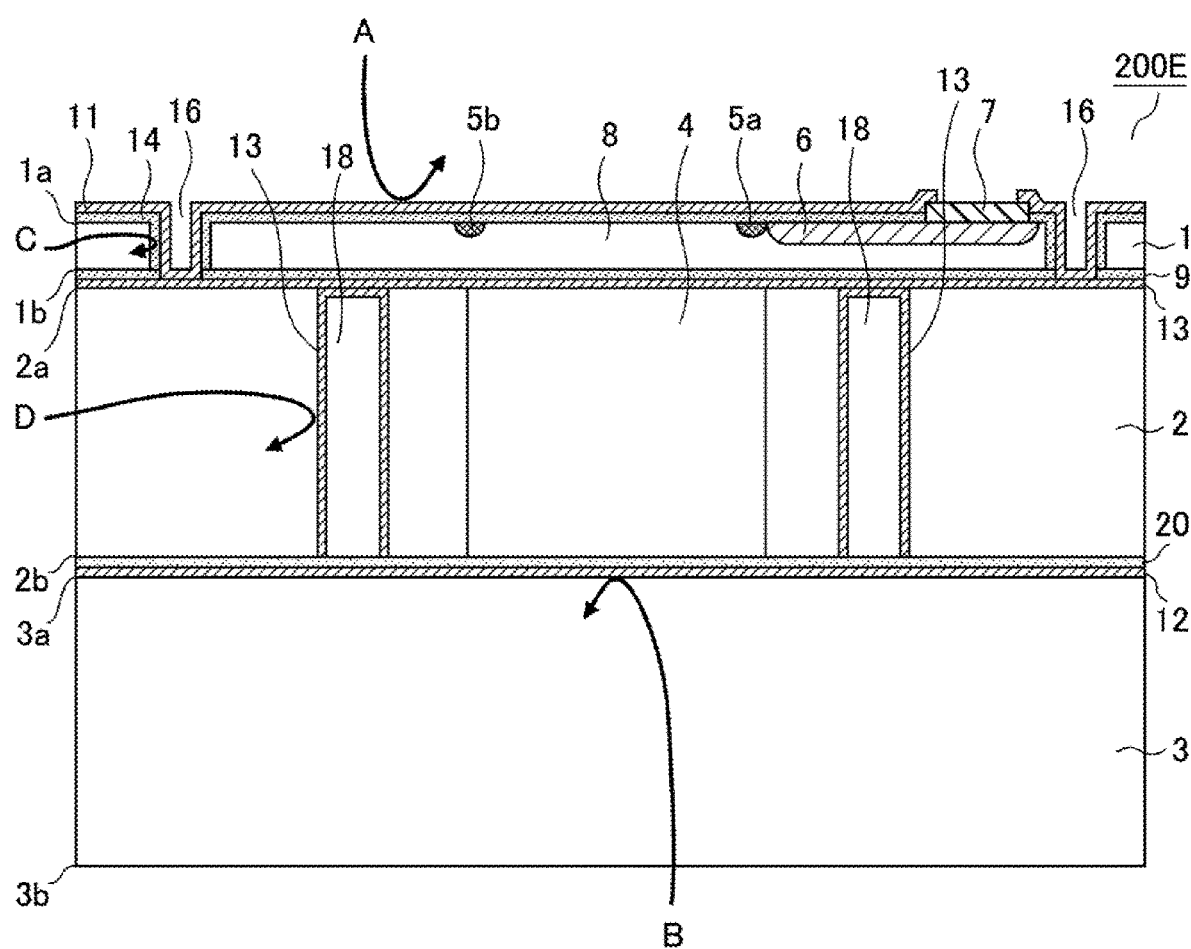
FIG. 16 is a sectional view showing a semiconductor pressure sensor element according to Tenth Embodiment of the invention.
Figure 17:
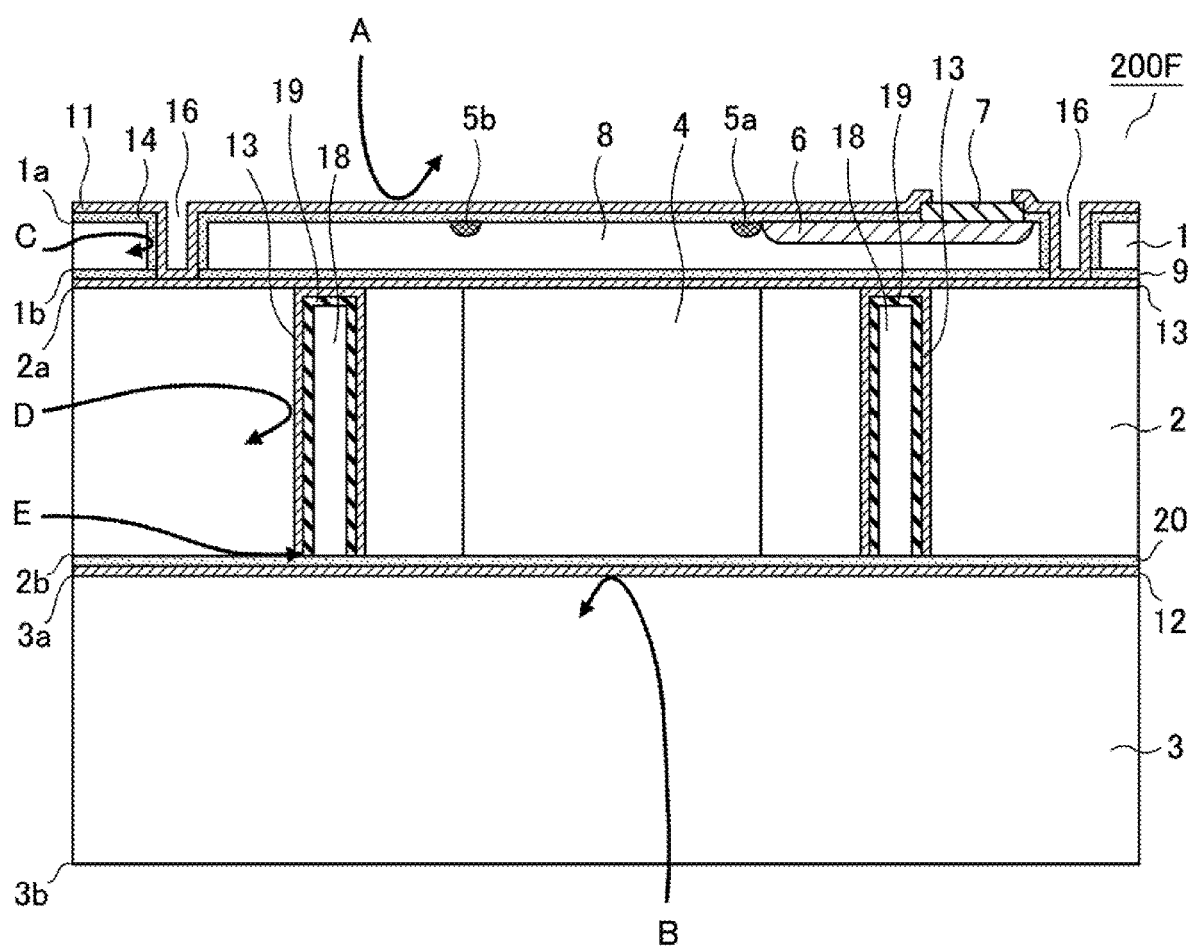
FIG. 17 is a sectional view showing the semiconductor pressure sensor element according to Tenth Embodiment of the invention.

FIGS. 16 and 17 show semiconductor pressure sensor elements according to Tenth Embodiment of the invention. Semiconductor pressure sensor elements 200E and 200F according to Tenth Embodiment each include a frame-like hole portion, which passes through from the principal surface 2a to the principal surface 2b of the second silicon substrate 2 so as to surround the reference pressure chamber 4, and a hydrogen storage chamber 18 formed of a space enclosed by the frame-like hole portion, the principal surface 1b of the first silicon substrate 1, and the principal surface 3a of the third silicon substrate 3. As the other components are the same as those of Ninth Embodiment, a description thereof will be omitted.

In Ninth Embodiment, the intrusion of hydrogen from the upper and lower surfaces, and the side surface, of the element is prevented by the first hydrogen permeation protection film 11, second hydrogen permeation protection film 12, and third hydrogen permeation protection film 13. When hydrogen still intrudes for some reasons, the hydrogen can be trapped before reaching the reference pressure chamber 4 by providing the hydrogen storage chamber 18.

By etching the second silicon substrate 2 from the side of the principal surface 2b, the hydrogen storage chamber 18 can be formed at the same time as the reference pressure chamber 4. Also, by forming the third hydrogen permeation protection film 13 inside the hydrogen storage chamber 18 before joining the second silicon substrate 2 and third silicon substrate 3, it is possible to effectively prevent the kind of hydrogen flux from the element side surface, shown by the arrow D in FIG. 16, from intruding into the reference pressure chamber 4.

Furthermore, it is effective to provide the hydrogen storage film 19, which is of a hydrogen storage material, inside the hydrogen storage chamber 18, as in the semiconductor pressure sensor element 200F shown in FIG. 17. For example, even when the hydrogen flux shown by the arrow E in FIG. 17 permeates the joining interface of the second silicon substrate 2 and third silicon substrate 3, the hydrogen flux is trapped by the hydrogen storage chamber 18 and stored in the hydrogen storage film 19, meaning that the hydrogen flux cannot introduce into the reference pressure chamber 4 in the back.

As the hydrogen storage film 19, it is possible to use an alloy consisting mainly of a transition metal, such as titanium (Ti), nickel (Ni), iridium (Ir), zirconium (Zr), or palladium (Pd), or an alloy consisting mainly of magnesium (Mg). A first transition metal-based alloy of titanium, nickel, or the like is inexpensive, and a second transition metal-based alloy of zirconium, palladium, or the like is more expensive than the first transition metal-based alloy but high in hydrogen capture efficiency.

Also, a magnesium alloy can capture a large amount of hydrogen gas in the operating temperature range of a fuel cell stack used in a fuel cell vehicle. In an automobile fuel cell system, the fuel cell stack is cooled, and in general, the operating temperature is controlled so as not to exceed 100° C. These hydrogen storage films 19 can all be formed by a versatile film formation method in a semiconductor wafer process such as sputtering.

According to the semiconductor pressure sensor elements 200E and 200F of Tenth Embodiment, in addition to the same advantageous effects as in Seventh to Ninth Embodiments, as it is possible to trap the hydrogen, which has intruded into the element, by providing the hydrogen storage chamber 18 so as to surround the reference pressure chamber 4, it is possible to reliably prevent the intrusion of hydrogen into the reference pressure chamber 4, leading to a further improvement in measurement precision.

Eleventh Embodiment

Figure 18:
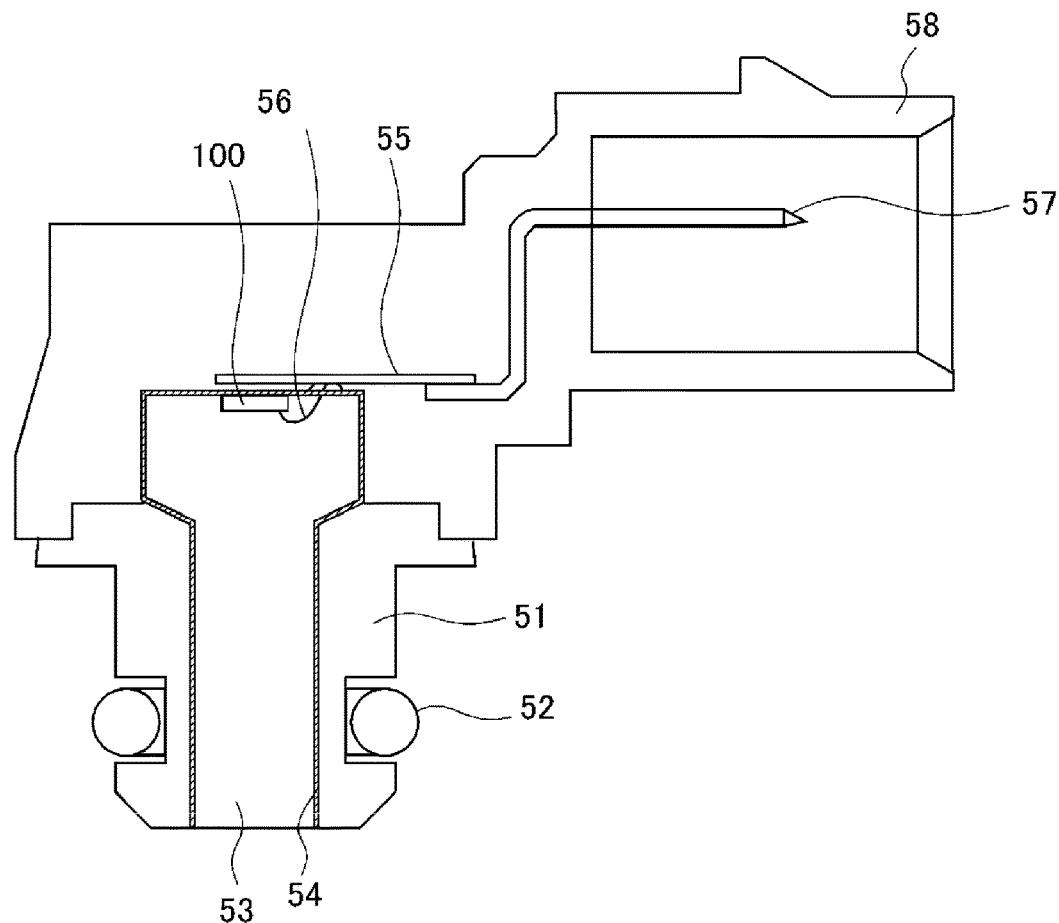
FIG. 18 is a sectional view showing a semiconductor pressure sensor according to Eleventh Embodiment of the invention.
Figure 19:
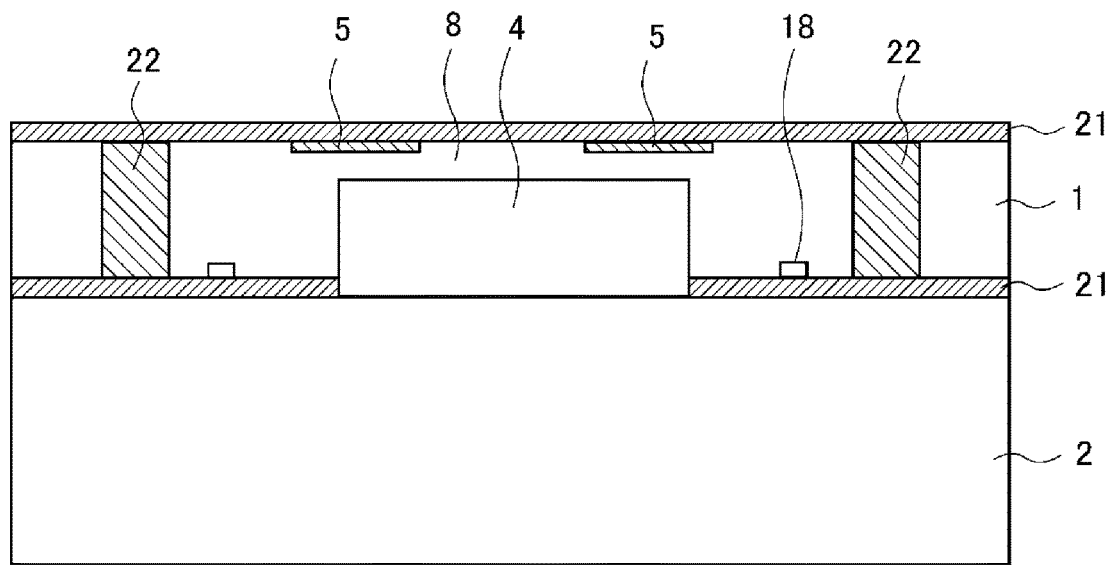
FIG. 19 is a sectional view showing a heretofore known semiconductor pressure sensor.

FIG. 18 shows a configuration example of a semiconductor pressure sensor on which is mounted the semiconductor pressure sensor element according to any one of First to Tenth Embodiments. FIG. 18 shows an example wherein the semiconductor pressure sensor element 100 according to First Embodiment is mounted. A pressure leading pipe 51 which leads a gas to be measured to the diaphragm of the semiconductor pressure sensor element 100 is installed in a pressure measurement portion of a fuel cell stack and hermetically sealed by an O-ring 52 having hydrogen resistance.

The semiconductor pressure sensor element 100 is installed in the back of a pressure leading hole 53 through which a hydrogen gas is led in, and the external electrode of the semiconductor pressure sensor element 100 is connected to a lead frame 55 via a gold wire 56. The lead frame 55 is connected to a terminal 57 of a connector 58, and an output signal from the semiconductor pressure sensor element 100 is taken out to an external device via the terminal 57.

As the material of a housing of the pressure sensor, a resin material, such as polybutylene terephthalate (PBT), is used as long as the air pressure is in a range of 10 atm or less immediately before the fuel cell stack, thereby enabling a reduction in cost. However, as there is the possibility that the hydrogen gas permeates the pressure leading pipe 51 itself, resulting in a decrease in measurement precision, depending on a usage environment such as temperature and humidity, it is desirable to provide a hydrogen permeation protection film 54 on the inner wall of the pressure leading pipe 51. As the material of the hydrogen permeation protection film 54, a thermoplastic resin, such as an ethylene-vinyl alcohol copolymer (EVOH), is suitable.

According to Eleventh Embodiment, in the semiconductor pressure sensor on which is mounted the semiconductor pressure sensor element according to any one of First to Tenth Embodiments, hydrogen is prevented from permeating the pressure leading pipe 51 by providing the hydrogen permeation protection film 54 on the inner wall of the pressure leading pipe 51, thus leading to a further improvement in measurement precision. The invention is such that it is possible to freely combine the individual embodiments, and to appropriately modify or omit any of the individual embodiments, without departing from the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A semiconductor pressure sensor, comprising:
    a first silicon substrate having a diaphragm;
    a first hydrogen permeation protection film provided on the side of one principal surface of the first silicon substrate;

a second silicon substrate, said second silicon substrate having a hole passing at least partially through said second silicon substrate from one principal surface of said second silicon substrate, said second silicon substrate being joined to another principal surface of the first silicon substrate via an embedded oxide film; and said hole forming a reference pressure chamber, the space of which is brought into a vacuum state, the semiconductor pressure sensor measuring the pressure of a hydrogen gas, wherein the first hydrogen permeation protection film has a thickness of 0.01 to 0.2 microns and is of silicon nitride ($SiN_x$), which satisfies $1 \leq x \leq 4/3$, or erbium oxide ($Er2O3$).

2. The semiconductor pressure sensor according to claim 1, wherein said hole passes only partially through said second silicon substrate to form a depressed portion, and said space of said reference pressure chamber is enclosed by the depressed portion and the other principal surface of the first silicon substrate.

3. The semiconductor pressure sensor according to claim 2, comprising:
a second hydrogen permeation protection film provided on the side of another principal surface of the second silicon substrate.

4. The semiconductor pressure sensor according to claim 3, comprising:
a stress relaxation film provided between the other principal surface of the second silicon substrate and the second hydrogen permeation protection film.

5. The semiconductor pressure sensor according to claim 4, wherein the stress relaxation film is a silicon oxide film.

6. The semiconductor pressure sensor according to claim 3, wherein
the second hydrogen permeation protection film is of silicon nitride ($SiNx$), which satisfies $1 \leq x \leq 4/3$, aluminum oxide ($AlOx$), or erbium oxide ($Er2O3$).

7. The semiconductor pressure sensor according to claim 2, comprising:
a further hydrogen permeation protection film provided between the one principal surface of the second silicon substrate and the embedded oxide film.

8. The semiconductor pressure sensor according to claim 7, wherein
a trench passing through from the one principal surface to the other principal surface of the first silicon substrate is provided so as to surround the reference pressure chamber, and
the first hydrogen permeation protection film is provided so as to cover the inside of the trench and is joined to the further hydrogen permeation protection film at the bottom portion of the trench.

9. The semiconductor pressure sensor according to claim 8, comprising:
a joining layer, which is formed by mutual diffusion, at the interface of the first hydrogen permeation protection film and the further hydrogen permeation protection film at the bottom portion of the trench.

10. The semiconductor pressure sensor according to claim 7, wherein
the further hydrogen permeation protection film is of silicon nitride ($SiNx$), which satisfies $1 \leq x \leq 4/3$, aluminum oxide ($AlOx$), or erbium oxide ($Er2O3$).

11. The semiconductor pressure sensor according to claim 2, comprising:
a hydrogen storage chamber which has a frame-like depressed portion provided in the one principal surface of the second silicon substrate so as to surround the reference pressure chamber, and which is formed of a space enclosed by the frame-like depressed portion and the other principal surface of the first silicon substrate.

12. The semiconductor pressure sensor according to claim 11, wherein the hydrogen storage chamber includes a hydrogen storage material inside.

13. The semiconductor pressure sensor according to claim 12, wherein
the hydrogen storage material is an alloy consisting mainly of titanium (Ti) or nickel (Ni).

14. The semiconductor pressure sensor according to claim 12, wherein
the hydrogen storage material is an alloy consisting mainly of zirconium (Zr) or palladium (Pd).

15. The semiconductor pressure sensor according to claim 12, wherein
the hydrogen storage material is an alloy consisting mainly of magnesium (Mg).

16. The semiconductor pressure sensor according to claim 2, wherein
a stress relaxation film is provided between the one principal surface of the first silicon substrate and the first hydrogen permeation protection film, said stress relaxation film having a thickness in a range of about 0.05 µm to 0.3 µm.

17. The semiconductor pressure sensor according to claim 16, wherein the stress relaxation film is a silicon oxide film.

18. The semiconductor pressure sensor according to claim 2, wherein
the reference pressure chamber has a first depressed portion, in which for the first silicon substrate and second silicon substrate to form capacitance, and a second depressed portion formed around the first depressed portion so as to be deeper than the first depressed portion.

19. The semiconductor pressure sensor according to claim 2, comprising:
a pressure leading pipe which leads a gas to be measured to the diaphragm, wherein
a hydrogen permeation protection film with a thermoplastic resin as a material is provided on the inner wall of the pressure leading pipe.

20. The semiconductor pressure sensor according to claim 1, wherein:
said hole passes through said second silicon substrate from said one principal surface to another principal surface of said second silicon substrate;
said semiconductor pressure sensor further comprises a third silicon substrate, one principal surface of which is joined to the other principal surface of the second silicon substrate; and
said space of said reference pressure chamber is enclosed by the hole, the other principal surface of the first silicon substrate, and the one principal surface of the third silicon substrate.

21. The semiconductor pressure sensor according to claim 20, comprising:
a second hydrogen permeation protection film provided between the other principal surface of the second silicon substrate and the one principal surface of the third silicon substrate.

22. The semiconductor pressure sensor according to claim 20, comprising:
a further hydrogen permeation protection film provided between the one principal surface of the second silicon substrate and the embedded oxide film.

23. The semiconductor pressure sensor according to claim 22, wherein
  a trench passing through from the one principal surface to the other principal surface of the first silicon substrate is provided so as to surround the reference pressure chamber, and
  the first hydrogen permeation protection film is provided so as to cover the inside of the trench and is joined to the further hydrogen permeation protection film at the bottom portion of the trench.

24. The semiconductor pressure sensor according to claim 23, comprising:
  a joining layer, which is formed by mutual diffusion, at the interface of the first hydrogen permeation protection film and further hydrogen permeation protection film at the bottom portion of the trench.

25. The semiconductor pressure sensor according to claim 20, comprising:
  a hydrogen storage chamber which has a frame-like hole portion, passing through from the one principal surface to the other principal surface of the second silicon substrate, provided so as to surround the reference pressure chamber, and which is formed of a space enclosed by the frame-like hole portion, the other principal surface of the first silicon substrate, and the one principal surface of the third silicon substrate.

26. The semiconductor pressure sensor according to claim 25, wherein
  the hydrogen storage chamber includes a hydrogen storage material inside.

27. The semiconductor pressure sensor according to claim 26, wherein
  the hydrogen storage material is an alloy consisting mainly of titanium (Ti) or nickel (Ni).

28. The semiconductor pressure sensor according to claim 26, wherein
  the hydrogen storage material is an alloy consisting mainly of zirconium (Zr) or palladium (Pd).

29. The semiconductor pressure sensor according to claim 26, wherein
  the hydrogen storage material is an alloy consisting mainly of magnesium (Mg).

30. The semiconductor pressure sensor according to claim 20, wherein
  a stress relaxation film is provided between the one principal surface of the first silicon substrate and the first hydrogen permeation protection film, said stress relaxation film having a thickness in a range of about 0.05 μm to 0.3 μm.

31. The semiconductor pressure sensor according to claim 30, wherein
  the stress relaxation film is a silicon oxide film.

32. The semiconductor pressure sensor according to claim 20, comprising:
  a pressure leading pipe which leads a gas to be measured to the diaphragm, wherein
  a hydrogen permeation protection film with a thermoplastic resin as a material is provided on the inner wall of the pressure leading pipe.

33. The semiconductor pressure sensor according to claim 21, wherein
  the second hydrogen permeation protection film is of silicon nitride (SiNx), which satisfies $1 \leq x \leq 4/3$, aluminum oxide (AlOx), or erbium oxide (Er2O3).

34. The semiconductor pressure sensor according to claim 22, wherein
  the further hydrogen permeation protection film is of silicon nitride (SiNx), which satisfies $1 \leq x \leq 4/3$, aluminum oxide (AlOx), or erbium oxide (Er2O3).

35. The semiconductor pressure sensor according to claim 2, wherein at least a portion of said depressed portion has a depth of no more than about 100 microns.

36. A semiconductor pressure sensor configured to measure the pressure of a hydrogen gas, comprising:
  a first silicon substrate having a diaphragm;
  a first hydrogen permeation protection film provided on the side of one principal surface of the first silicon substrate;
  a second silicon substrate, said second silicon substrate having a hole passing at least partially through said second silicon substrate from one principal surface of said second silicon substrate, said second silicon substrate being joined to another principal surface of the first silicon substrate via an embedded oxide film, said hole forming a reference pressure chamber, the space of which is brought into a vacuum state;
  a second hydrogen permeation protection film provided on the side of another principal surface of the second silicon substrate; and
  a stress relaxation film provided between the other principal surface of the second silicon substrate and the second hydrogen permeation protection film.

37. The semiconductor pressure sensor according to claim 36, wherein the first hydrogen permeation protection film has a thickness of 0.01 to 0.2 microns and is of silicon nitride (SiN$_x$), which satisfies $1 \leq x \leq 4/3$, or erbium oxide (Er2O3).

* * * * *